(12) United States Patent
Ikeda

(10) Patent No.: US 8,187,957 B2
(45) Date of Patent: May 29, 2012

(54) FIELD-EFFECT TRANSISTOR AND METHOD FOR FABRICATING THE SAME

(75) Inventor: Keiji Ikeda, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/917,381

(22) Filed: Nov. 1, 2010

(65) Prior Publication Data
US 2011/0045663 A1 Feb. 24, 2011

Related U.S. Application Data

(62) Division of application No. 11/415,199, filed on May 2, 2006, now Pat. No. 7,825,493.

(30) Foreign Application Priority Data

Sep. 9, 2005 (JP) ................................. 2005-262725
Feb. 9, 2006 (JP) ................................. 2006-032652

(51) Int. Cl.
*H01L 21/265* (2006.01)
(52) U.S. Cl. ................. 438/519; 438/938; 257/E21.336
(58) Field of Classification Search .................. 438/519, 438/521, 938
See application file for complete search history.

(56) References Cited

U.S. PATENT DOCUMENTS

| 5,266,813 | A | 11/1993 | Comfort et al. |
| 6,621,131 | B2 | 9/2003 | Murthy et al. |
| 6,844,227 | B2 | 1/2005 | Kubo et al. |
| 7,053,400 | B2 * | 5/2006 | Sun et al. ................. 257/19 |
| 7,528,058 | B2 | 5/2009 | Mantl et al. |
| 2003/0189226 | A1 | 10/2003 | Tsui et al. |
| 2004/0014276 | A1 | 1/2004 | Murthy et al. |
| 2005/0093033 | A1 | 5/2005 | Kinoshita et al. |

FOREIGN PATENT DOCUMENTS

| DE | 10334353 | 2/2005 |
| JP | 2003-318189 A | 11/2003 |
| JP | 2004-327777 A | 11/2004 |
| JP | 2005-079277 A | 3/2005 |
| JP | 2005-101588 A | 4/2005 |
| JP | 2005-209782 A | 8/2005 |
| JP | 2005-217391 A | 8/2005 |

OTHER PUBLICATIONS

"Extended European Search Report", mailed Jun. 3, 2009 regarding corresponding EuropeanPatent Application No. 06252151.

(Continued)

*Primary Examiner* — Chandra Chaudhari
(74) *Attorney, Agent, or Firm* — Fujitsu Patent Center

(57) ABSTRACT

A field-effect transistor that increases the operation speeds of complementary field-effect transistors. Each of an nMOSFET and a pMODFET has a Ge channel and source and drain regions formed of an NiGe layer. The height of Schottky barriers formed at a junction between a channel region and the source region of the nMOSFET and at a junction between the channel region and the drain region of the nMOSFET is changed by very thin high-concentration segregation layers formed by making As atoms, Sb atoms, S atoms or the like segregate at the time of forming the NiGe layer. As a result, Schottky barrier height suitable for the nMOSFET and the pMODFET can be obtained, this being capable of realizing high-speed CMOSFETS.

5 Claims, 36 Drawing Sheets

OTHER PUBLICATIONS

Han, De-Dong et al.,"Fabrication and characteristics of Ni-germanide Schottky contacts with Ge",Chinese Physics, vol. 14, No. 5 May 1, 2005, 1041-1043.

Ikeda, Keiji et al.,"Moduration of NiGe/Ge Schottky barrier height by sulfur segregation during Ni germanidation",Applied Physics Letters, vol. 88, No. 15 Apr. 14, 2006, 152115.

Kinoshita, A et al.,"High-performance 50-nm-gate-length schottky-source/drain MOSFETs with dopant-segregation junctions",2005 Symposium on VLSI Technology Digest of Technical Papers Jun. 14, 2005, 158-159.

Shimizu et al., Local Mechanical-Stress Control (LMC): A New Technique for CMOS-Performance, 2001, IEEE, pp. 19.4.1-19.4.4.

USPTO, [Wright] "U.S. Appl. No. 11/415,199 (parent)",[CTRS] Requirement for Restriction/Election issued on Mar. 20, 2008.

USPTO, [Wright] "U.S. Appl. No. 11/415,199 (parent)",[CTNF] Non-Final Office Action issued on Oct. 14, 2009.

USPTO, [Wright] "U.S. Appl. No. 11/415,199 (parent)",[CTNF] Non-Final Office Action issued on Jul. 9, 2008.

USPTO, [Wright] "U.S. Appl. No. 11/415,199 (parent)",[CTFR] Final Rejection issued on Feb. 4, 2009.

USPTO, [Wright] "U.S. Appl. No. 11/415,199 (parent)",[NOA] Notice of Allowance and Fee(s) Due issued on Jun. 24, 2010.

Japanese Office Action mailed Oct. 4, 2011 for corresponding Japanese Application No. 2006-032652, with partial English-language translation.

* cited by examiner

FIELD-EFFECT TRANSISTOR AND METHOD FOR FABRICATING THE SAME

CROSS-REFERENCE TO RELATED APPLICATIONS

This application is based upon and claims the benefits of priority from the prior Japanese Patent Application Nos. 2005-262725, filed on Sep. 9, 2005 and 2006-032652, filed on Feb. 9, 2006, the entire contents of which are incorporated herein by reference.

BACKGROUND OF THE INVENTION (1) Field of the Invention

This invention relates to a field-effect transistor and a method for fabricating such a field-effect transistor and, more particularly, to a field-effect transistor in which germanium (Ge) or silicon germanium (SiGe) is used as a channel material and a method for fabricating such a field-effect transistor.

(2) Description of the Related Art

Metal oxide semiconductor field effect transistors (MOSFETs) in which silicon (Si) is used as a channel material are widely used now. In recent years an attempt to improve carrier mobility by, for example, applying a stress to a channel region has been made (see, for example, U.S. Pat. No. 6,621,131). In addition, to improve carrier mobility, the development of, for example, a MOSFET in which germanium is used as a channel material is under development.

Conventional germanium channel MOSFETs in which germanium is used as a channel material have the same structure as existing silicon channel MOSFETs in which silicon is used as a channel material. In many cases, diffusion layers doped with impurities are used as source and drain regions in such germanium channel MOSFETs.

So far, however, only germanium p-channel MOSFETs are under development. If a germanium channel MOSFET is fabricated by using a Ge substrate or the like, the Ge substrate or the like is doped with n-type impurity atoms to form diffusion layers as source and drain regions. By doing so, pn junctions are formed between a channel region and the source region and between the channel region and the drain region. Usually diffusion coefficients for n-type impurities are high and their solid solubility is low. Therefore, if the above method is used, it is essentially difficult to form pn junctions between the channel region and the source region and between the channel region and the drain region. This is one reason why it was difficult to realize a very minute germanium n-channel MOSFET. As a result, minute high-speed complementary metal oxide semiconductor field effect transistors (CMOSFETs) including a germanium p-channel MOSFET and a germanium n-channel MOSFET have not been realized yet.

To increase operation speed, a method for using silicon germanium as a channel material has conventionally been examined as well. However, the same applies to such a silicon germanium channel MOSFET.

SUMMARY OF THE INVENTION

The present invention was made under the background circumstances described above. An object of the present invention is to provide a high-speed field-effect transistor in which germanium or silicon germanium is used as a channel material and a method for fabricating such a field-effect transistor.

In order to achieve the above first object, complementary field-effect transistors are provided. These complementary field-effect transistors comprise an n-channel field-effect transistor and a p-channel field-effect transistor each having an $Si_xGe_{1-x}$ ($0 \leq x < 1$) channel region and source and drain regions formed of an intermetallic compound which contains germanium.

In addition, in order to achieve the above second object, a method for fabricating complementary field-effect transistors is provided. This method comprises the processes of forming a metallic film on $Si_xGe_{1-x}$ ($0 \leq x < 1$) where a channel region of an n-channel field-effect transistor and a channel region of a p-channel field-effect transistor are to be formed with a region where the channel region of the n-channel field-effect transistor is to be formed between and with a region where the channel region of the p-channel field-effect transistor is to be formed between; and performing heat treatment to form source and drain regions of an intermetallic compound which contains germanium on both sides of the region where the channel region of the n-channel field-effect transistor is to be formed and on both sides of the region where the channel region of the p-channel field-effect transistor is to be formed.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Embodiments of the present invention will now be described in detail with reference to the drawings by taking CMOSFETs as an example.

Descriptions will be provided by taking CMOSFETs including an n-channel MOSFET (nMOSFET) and a p-channel MOSFET (pMOSFET) each having a germanium channel and source and drain regions formed of an intermetallic compound as an example.

Electron mobility in germanium bulk is twice as great as electron mobility in silicon bulk and hole mobility in germanium bulk is four times as great as hole mobility in silicon bulk. Simply speaking, it is expected that the current driving capability of a germanium channel nMOSFET in which germanium is used as a channel material is twice as great as the current driving capability of a silicon channel nMOSFET and that the current driving capability of a germanium channel pMOSFET in which germanium is used as a channel material is four times as great as the current driving capability of a silicon channel pMOSFET. However, a germanium channel MOSFET differs slightly from a silicon channel MOSFET in state of inversion layer.

Source and drain regions in a germanium channel nMOSFET formed of an intermetallic compound can be made shallow compared with source and drain regions which are impurity diffusion layers. Similarly, source and drain regions in a germanium channel pMOSFET formed of an intermetallic compound can be made shallow compared with source and drain regions which are impurity diffusion layers. In addition, parasitic resistance can be reduced by about 90 percent by forming source and drain regions with an intermetallic compound. Source and drain regions in a germanium channel MOSFET may be formed of an intermetallic compound which contains, for example, germanium. Such an intermetallic compound can be formed by forming a predetermined metal film on a germanium substrate or a germanium layer and by performing heat treatment. This will be described later.

As stated above, high-speed CMOSFETs can be fabricated by forming channel regions in the nMOSFET and the pMOSFET with germanium and by forming the source and drain regions in the nMOSFET and the pMOSFET with an intermetallic compound which contains germanium.

By the way, germanium has the following characteristic. If a metal/semiconductor junction (Schottky junction) is formed, an interface state at the junction is strongly pinned in the energy bad gap of germanium regardless of the work function of the metal.

Figure 1A:
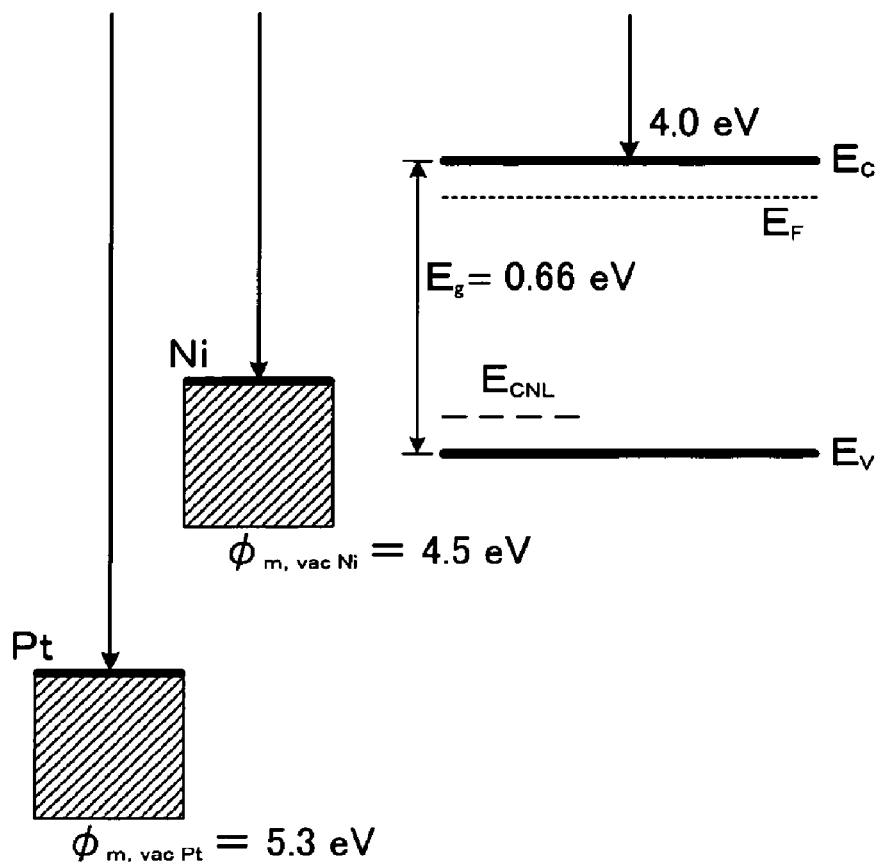
FIGS. 1A and 1B are views showing the band structure of germanium, FIG. 1A being a view showing the relationship between the band structure of germanium and the work functions of metals, FIG. 1B being a view showing a state obtained when germanium and a metal are joined.
Figure 1B:
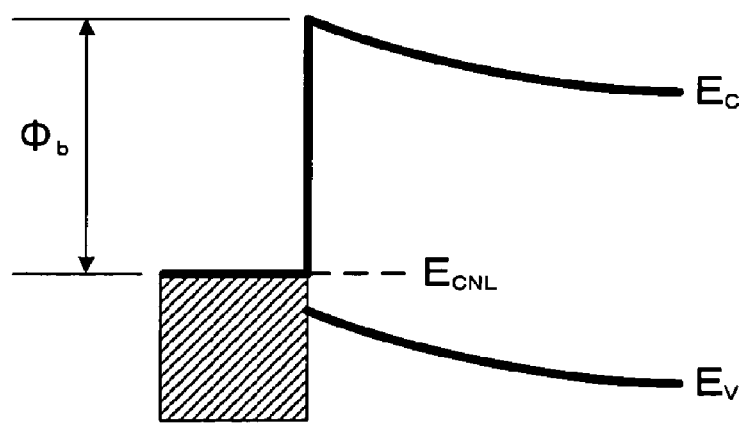

FIGS. 1A and 1B are views showing the band structure of germanium. FIG. 1A is a view showing the relationship between the band structure of germanium and the work functions of metals. FIG. 1B is a view showing a state obtained when germanium and a metal are joined.

As shown in FIG. 1A, the conduction band ($E_c$) and energy band gap ($E_g$) of germanium are 4.0 eV and 0.66 eV, respectively, with a vacuum energy level as reference. On the other hand, for example, the work function ($\phi_{m, vacNi}$) of nickel (Ni) is 4.5 eV and the work function ($\phi_{m, vacPt}$) of platinum (Pt) is 5.3 eV. In particular, the work function of platinum exceeds the energy band gap of germanium. Even if nickel and platinum which differ significantly in work function are used, an interface state at a junction is pinned at some level, that is to say, at a charge neutrality level $E_{CNL}$ shown in FIGS. 1A and 1B. In the case of germanium, $E_{CNL}$ is about 0.06 to 0.1 eV higher than the valence band ($E_V$). In FIGS. 1A and 1B, $E_F$ and $\phi_b$ indicate the Fermi level of germanium and Schottky barrier height for electrons, respectively.

A pinning phenomenon which occurs at a Schottky junction interface is often evaluated by the S value. The S value is an index indicative of the dependence of Schottky barrier height on the work functions of metals and indicates a slope obtained by plotting Schottky barrier height obtained with each of plural kinds of metals with respect to the work functions of the plural kinds of metals. For example, the S value of germanium is very close to zero. That is to say, Schottky barrier height is approximately constant at a junction interface between a metal and germanium regardless of the kind of the metal and very strong pinning occurs there. The S value of silicon which has traditionally been used widely as a channel material is greater than that of germanium and the S value of silicon oxide (SiO$_2$) which is widely used as a gate insulating film or the like is approximately one.

Figure 2:
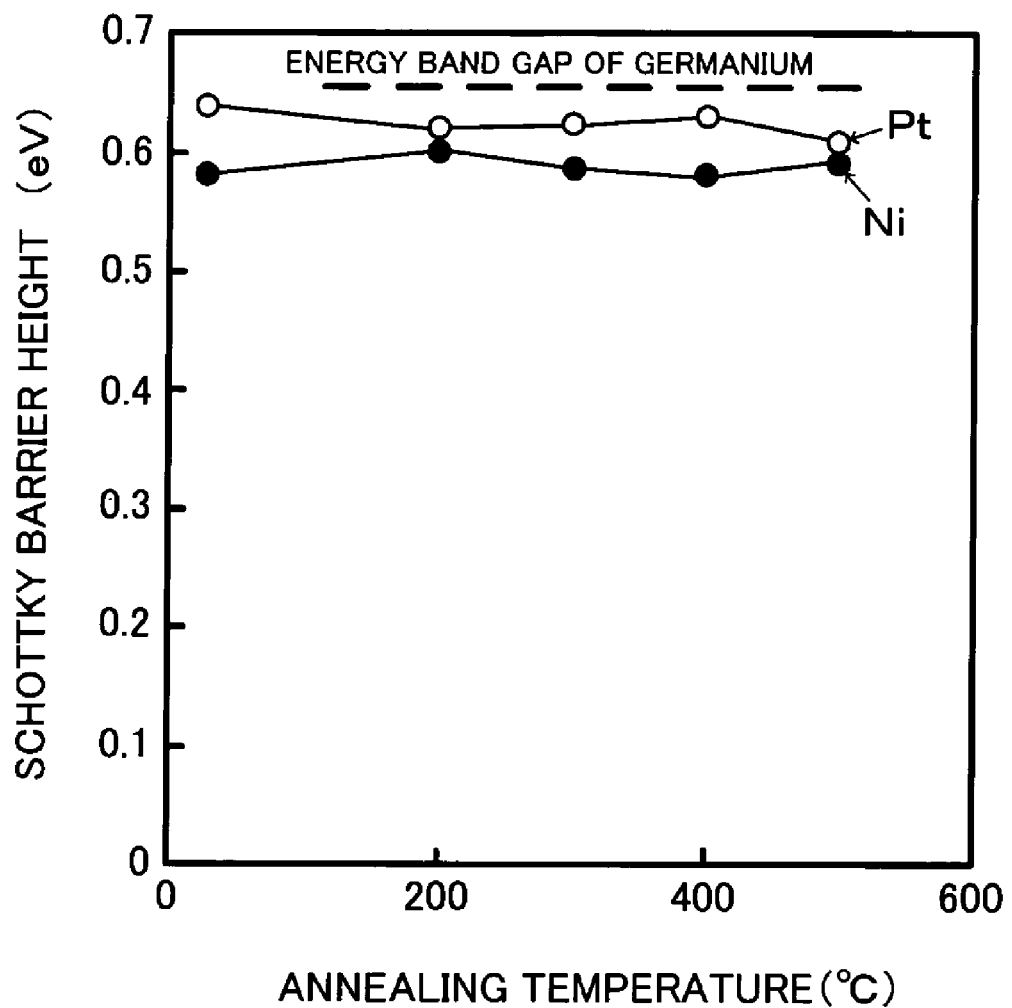
FIG. 2 shows the relationship between annealing temperature and Schottky barrier height.

FIG. 2 shows the relationship between annealing temperature and Schottky barrier height. In FIG. 2, a horizontal axis indicates annealing temperature (° C.) and a vertical axis indicates Schottky barrier height (eV).

If each of a combination of Nickel and Germanium and a combination of platinum and germanium is used for forming a germanide/germanium junction, the relationship between annealing temperature and Schottky barrier height for electrons is shown in FIG. 2. Whichever of nickel and platinum is used, Schottky barrier height obtained is about 0.6 eV regardless of annealing temperature. That is to say, Schottky barrier height obtained is approximately constant. Therefore, very strong pinning occurs at a junction interface between an intermetallic compound and germanium. This means that the pinning characteristic of germanium is very strong.

As stated above, it is assumed that CMOSFETs including an nMOSFET and a pMOSFET in each of which a channel region is formed of germanium and in each of which source and drain regions are formed of an intermetallic compound that contains germanium are fabricated. In this case, Schottky barrier height for holes in the ON state is about 0.06 to 0.1 eV in the pMOSFET regardless of the kind of a metal used, while Schottky barrier height for electrons in the ON state is about 0.56 to 0.6 eV in the nMOSFET regardless of the kind of a metal used.

As stated above, if germanium is used as a channel material and an intermetallic compound, such as nickel germanide (NiGe) or platinum germanium (PtGe), is formed in source and drain regions, a Schottky barrier against a hole becomes low and a Schottky barrier against an electron becomes high. The reason for this is that a pinning position is near the valence band.

As described below, in the present invention a layer is formed at a junction interface between germanium, being a channel region, and an intermetallic compound, being source and drain regions, by making predetermined atoms segregate. As a result, a Schottky barrier against each carrier and, more particularly, a Schottky barrier against electrons in the nMOSFET is lowered and the current driving capability of the CMOSFETs is improved.

Figure 3:
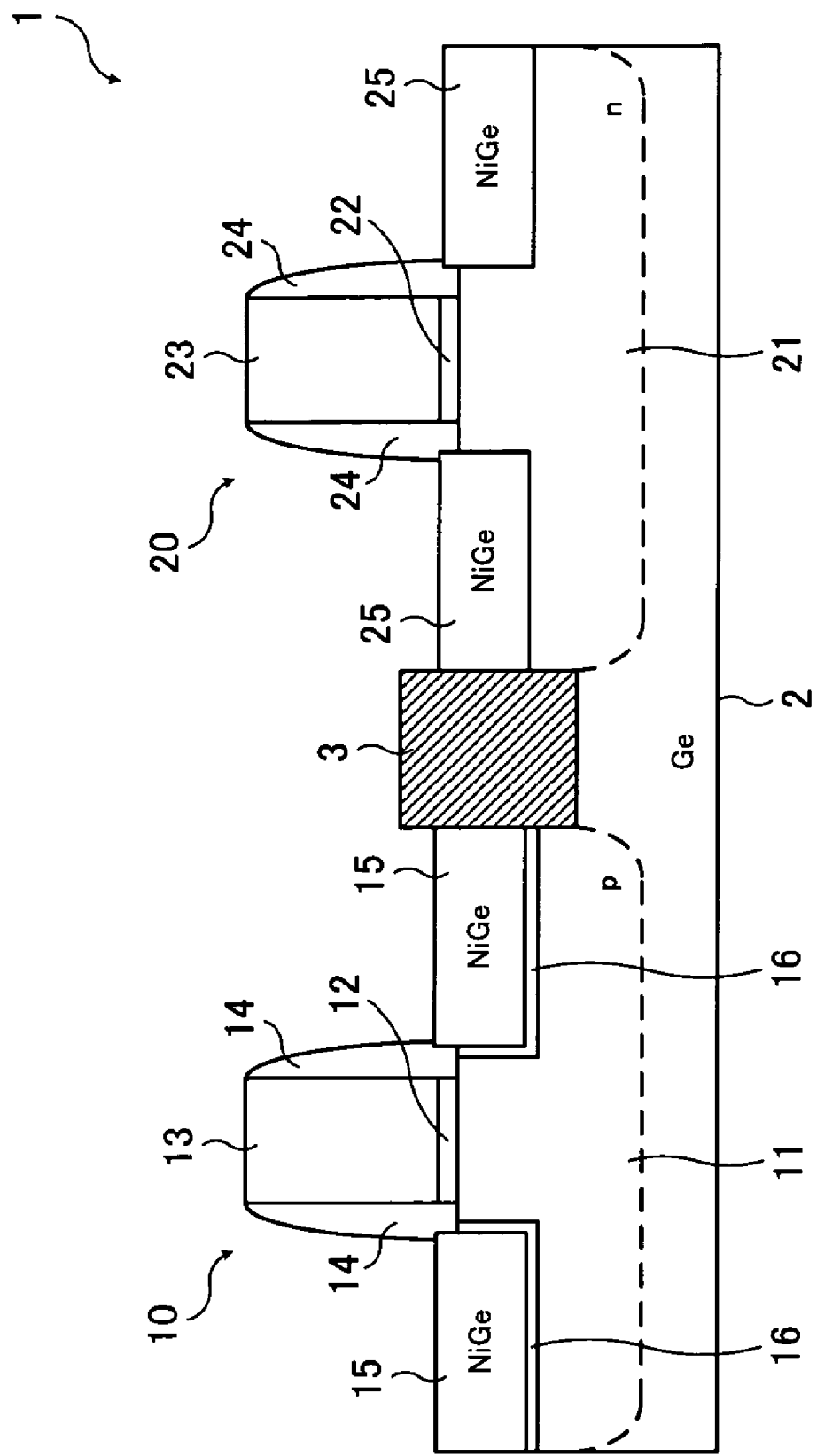
FIG. 3 shows an example of a method for fabricating CMOSFETs.

FIG. 3 shows an example of a method for fabricating CMOSFETs.

With CMOSFETs 1 shown in FIG. 3, an nMOSFET 10 and a pMOSFET 20 are formed on a Ge substrate 2. The nMOSFET 10 and the pMOSFET 20 are separated by a shallow trench isolation (STI) 3.

The nMOSFET 10 has a gate electrode 13 formed over the Ge substrate 2 where a p-well 11 is formed with a gate insulating film 12 between. A sidewall 14 is formed on the sides of the gate insulating film 12 and the gate electrode 13. An NiGe layer 15, being an intermetallic compound formed of germanium and nickel, is formed on both sides of the gate electrode 13 on the side of which the sidewall 14 is formed. As described later, a very thin segregation layer 16 is formed at a junction interface between the NiGe layer 15 and the Ge substrate 2 by making predetermined atoms segregate at high concentration.

Similarly, the pMOSFET 20 has a gate electrode 23 formed over the Ge substrate 2 where an n-well 21 is formed with a gate insulating film 22 between. A sidewall 24 is formed on the sides of the gate insulating film 22 and the gate electrode 23. An NiGe layer 25 is formed on both sides of the gate electrode 23 on the side of which the sidewall 24 is formed.

For example, germanium oxynitride (GeON) films formed by performing oxynitriding treatment on the surface of the Ge substrate 2, or SiO$_2$ films, silicon oxynitride (SiON) films, or high-dielectric-constant (high-k) insulating films formed on the Ge substrate 2 by deposition can be used as the gate insulating films 12 and 22. Zirconium oxide (ZrO$_2$) films, zirconium oxynitride (ZrON) films, zirconium silicate (ZrSiO) films, zirconium silicon oxynitride (ZrSiON) films, hafnium oxide (HfO$_2$) films, hafnium oxynitride (HfON) films, hafnium silicate (HfSiO) films, hafnium silicon oxynitride (HfSiON) films, aluminum oxide (Al2O$_3$) films, hafnium aluminate (HfAlO) films, hafnium nitride aluminate (HfAlON) films, lanthanum oxide (La$_2$O$_3$) films, or lanthanum aluminate (LaAlO) films can be used as such high-k insulating films.

As stated above, in the CMOSFETs 1 shown in FIG. 3, source and drain regions of the nMOSFET 10 are the NiGe layer 15 formed of an intermetallic compound and source and drain regions of the pMOSFET 20 are the NiGe layer 25 formed of the intermetallic compound. In other words, junctions in the nMOSFET 10 between a channel region and the source region and between the channel region and the drain region and junctions in the pMOSFET 20 between a channel region and the source region and between the channel region and the drain region are not conventional pn junctions formed by diffusion, but junctions between the NiGe layer 15 and the Ge substrate 2 and junctions between the NiGe layer 25 and the Ge substrate 2, respectively. That is to say, the junctions in the nMOSFET 10 and the pMOSFET 20 are Schottky junctions.

With the CMOSFETs 1 having the above structure, the height of Schottky barrier at the junctions between the NiGe layer 15 and the Ge substrate 2 or between the NiGe layer 25 and the Ge substrate 2 is an important parameter which determines an ON-state current that runs through the nMOSFET 10 and the pMOSFET 20.

If CMOSFETs having germanium channels are fabricated by using Schottky junctions, usually only Schottky barrier height suitable for a pMOSFET can be obtained because of strong pinning at a germanide/germanium junction. Accordingly, in the present invention impurity atoms such as phosphorus (P), arsenic (As), antimony (Sb), boron (B), aluminum (Al), or gallium (Ga) or atoms such as sulfur (S), selenium (Se), or tellurium (Te) are made to segregate at Schottky junction interfaces in the nMOSFET and the pMOSFET to form very thin high-concentration segregation layers. The Schottky barrier height is changed by the segregation layers to realize Schottky barrier height suitable for each of the nMOSFET and the pMOSFET.

In this case, group V impurity atoms, such as phosphorus, arsenic, or antimony, or group VI atoms, such as sulfur, selenium, or tellurium, are used for forming the segregation layers at the Schottky junction interfaces in the nMOSFET. On the other hand, group III impurity atoms, such as boron, aluminum, or gallium, or group VI atoms, such as sulfur, selenium, or tellurium, are used for forming the segregation layers at the Schottky junction interfaces in the pMOSFET.

Figure 4:
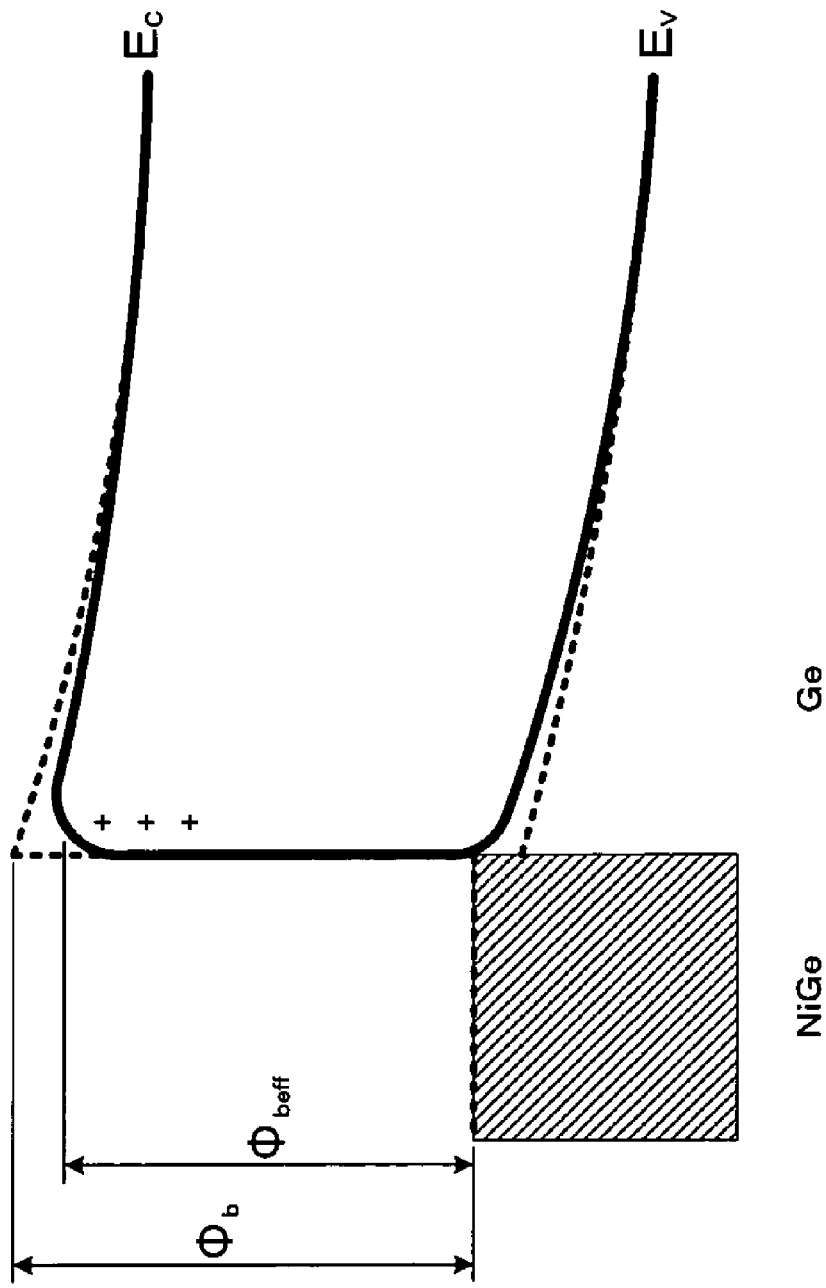
FIG. 4 is a first view for describing the mechanism of a change in Schottky barrier height.
Figure 5:
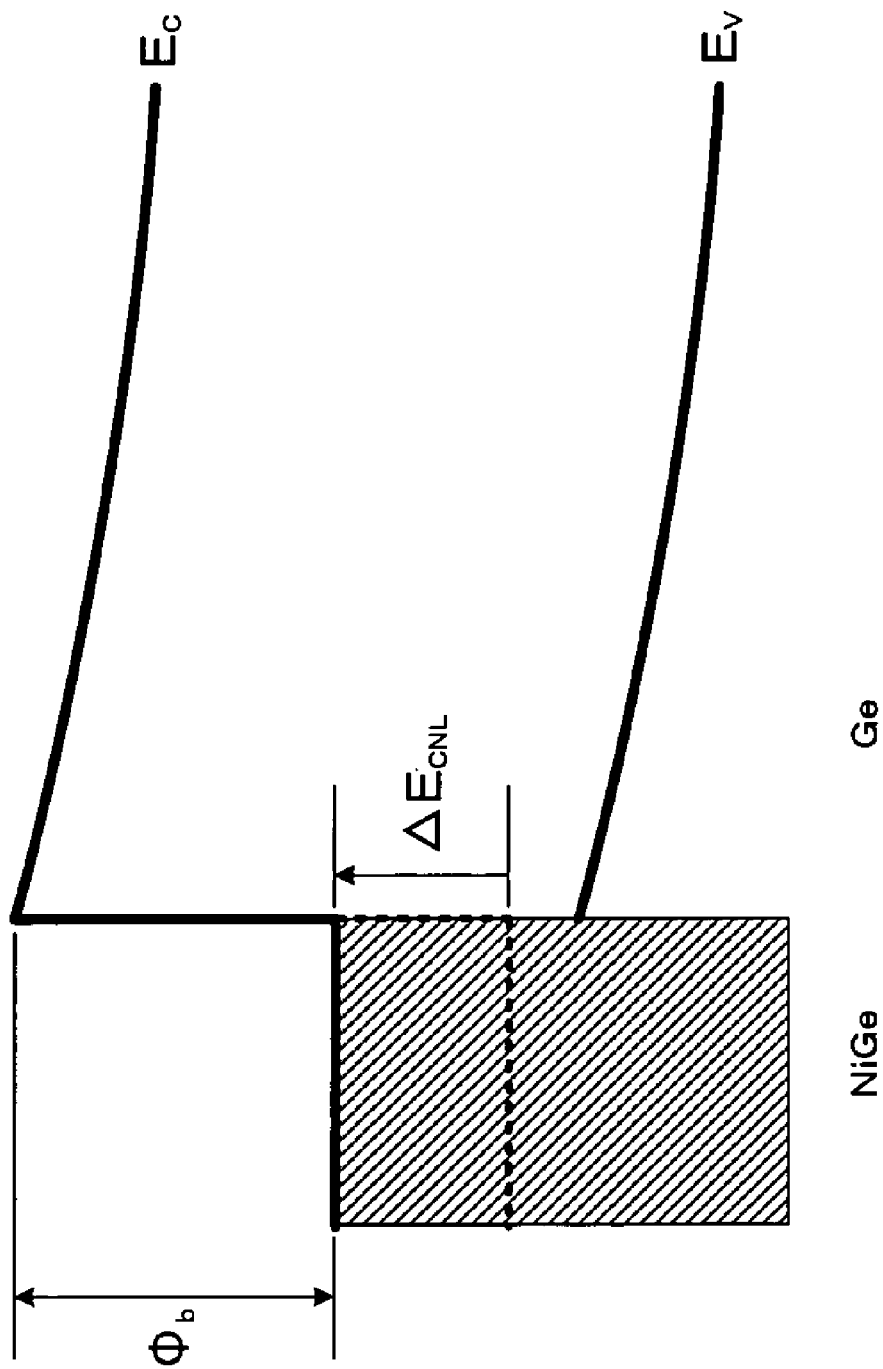
FIG. 5 is a second view for describing the mechanism of a change in Schottky barrier height.

FIGS. 4 and 5 are views for describing the mechanisms of a change in Schottky barrier height.

If group V impurity atoms, such as phosphorus, arsenic, or antimony, are used for forming a segregation layer, Schottky barrier height is changed through a mechanism shown in FIG. 4. That is to say, after group V impurity atoms introduced into the segregation layer at a Schottky junction interface emit electrons, the impurity atoms become positive ions and are stuck in a region near the junction interface. In this case, many electrons exist on the intermetallic compound side, so these electrons and the positive ions on the segregation layer side pull against each other by Coulomb force. As a result, what is called image force is produced. On the whole, the higher group V impurity atom concentration is in a region very close to the intermetallic compound, the more powerful the image force is. By forming the segregation layer in a region very close to the intermetallic compound and producing the image force, effective Schottky barrier height ($\phi_{beff}$) falsely lower than Schottky barrier height obtained by joining the intermetallic compound and germanium together (Schottky barrier height ($\phi_b$) obtained when a segregation layer is not formed) can be obtained. As a result, a tunnel current which passes through the junction interface increases.

To effectively produce such effective Schottky barrier height, the segregation layer should be formed so that the above positive ions will be in a depletion layer formed at the junction interface between the intermetallic compound and germanium.

The same applies to the case where group III impurity atoms, such as boron, aluminum, or gallium, are used for forming a segregation layer. Image force is produced by forming a segregation layer in which the concentration of such impurity atoms is high in a region very close to the intermetallic compound. As a result, Schottky barrier height for holes can falsely be lowered.

If group VI atoms, such as sulfur, selenium, or tellurium, are used for forming a segregation layer, Schottky barrier height is changed through a mechanism shown in FIG. 5. That is to say, by making dangling bonds at the Schottky junction interface absorb atoms, such as sulfur, selenium, or tellurium, and changing the interface state, a pinning position changes and Schottky barrier height changes. The electronegativity of group VI atoms, such as sulfur, selenium, or tellurium, used is high. When group VI atoms, such as sulfur, selenium, or tellurium, are introduced into the Schottky junction interface, the dangling bonds at the Schottky junction interface absorb these group VI atoms and these group VI atoms bridge atoms each having a dangling bond. As a result, the Schottky junction interface is stabilized energetically and the interface state changes. Accordingly, a charge neutrality level shifts ($\Delta E_{CNL}$) and Schottky barrier height for electrons lowers.

As stated above, the mechanism of a change in Schottky barrier height which functions in the case of phosphorus, arsenic, antimony, boron, aluminum, gallium, or the like being used for forming a segregation layer differs from the mechanism of a change in Schottky barrier height which functions in the case of sulfur, selenium, tellurium, or the like being used for forming a segregation layer. For example, it is possible to form a segregation layer at a Schottky junction interface in an nMOSFET by using not only impurity atoms, such as phosphorus, arsenic, or antimony, but also atoms, such as sulfur, selenium, or tellurium, or to form a segregation layer at a Schottky junction interface in a pMOSFET by using not only impurity atoms, such as boron, aluminum, or gallium, but also atoms, such as sulfur, selenium, or tellurium. By forming a segregation layer with different kinds of atoms which differ in the mechanism of changing Schottky barrier height, the effect of changing Schottky barrier height which is obtained by using each kind of atoms can be gained.

The formation of a segregation layer at a junction interface between nickel germanide and germanium will now be described as an example.

Figure 6:
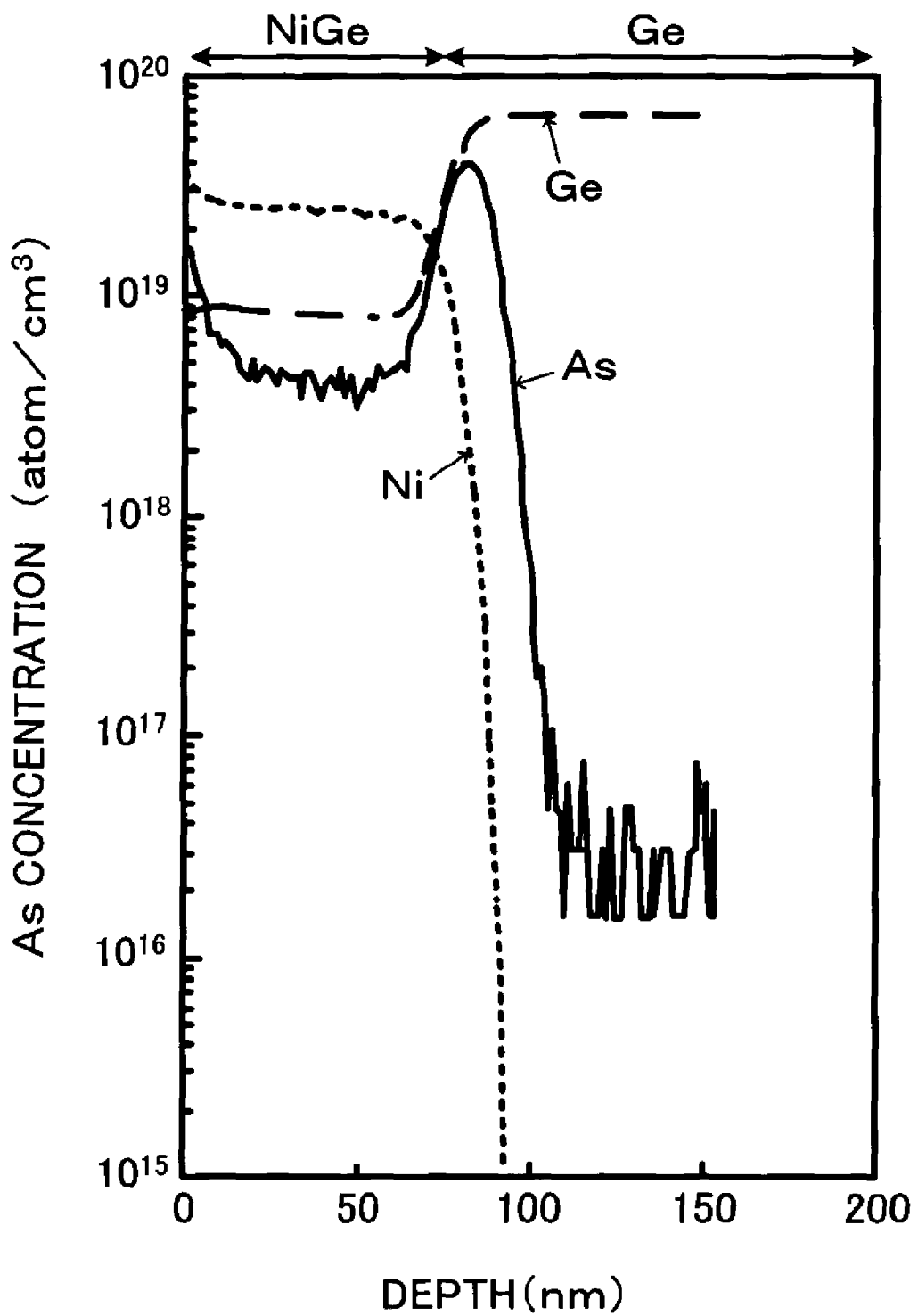
FIG. 6 shows an example of forming a segregation layer of arsenic impurity atoms.
Figure 7:
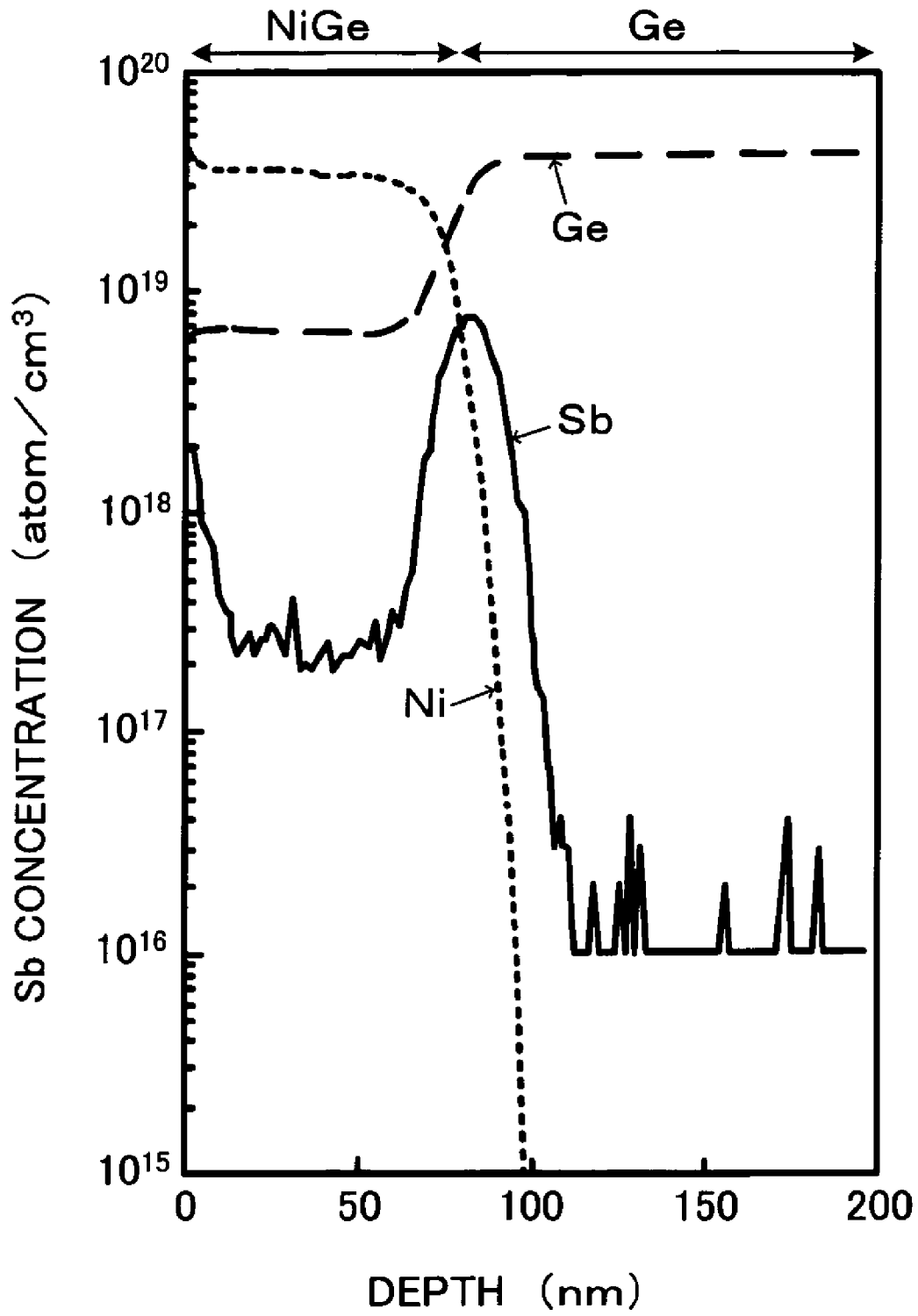
FIG. 7 shows an example of forming a segregation layer of antimony impurity atoms.
Figure 8:
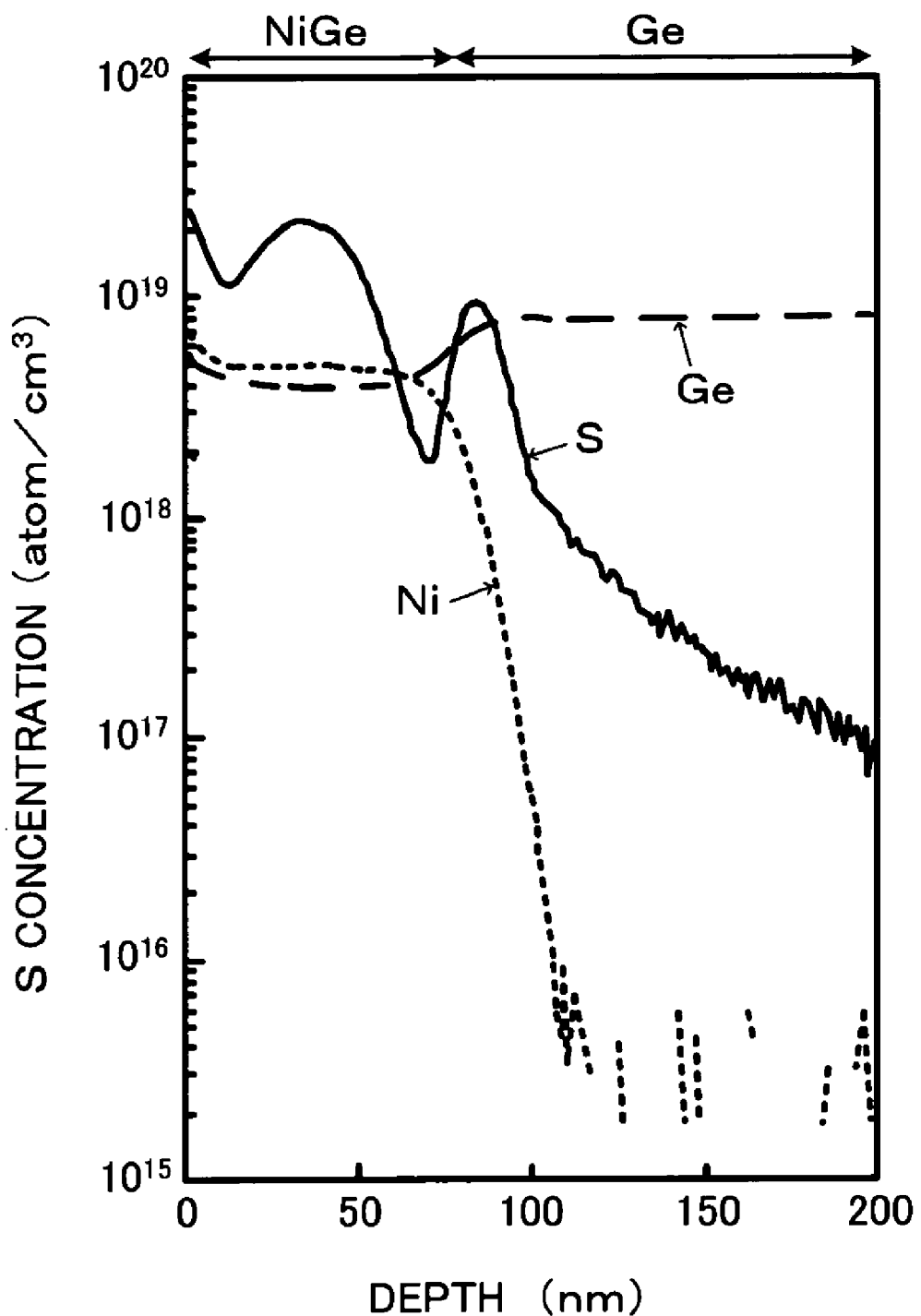
FIG. 8 shows an example of forming a segregation layer of sulfur impurity atoms.

FIG. 6 shows an example of forming a segregation layer of arsenic impurity atoms. FIG. 7 shows an example of forming a segregation layer of antimony impurity atoms. FIG. 8 shows an example of forming a segregation layer of sulfur impurity atoms. In FIGS. 6 through 8, horizontal axes indicate depth (nm) from the surface of an NiGe layer formed on a Ge substrate and vertical axes indicate As concentration (atoms/cm$^3$), Sb concentration (atoms/cm$^3$), and S concentration (atoms/cm$^3$), respectively.

For example, the structure of an nMOSFET in which a segregation layer of arsenic impurity atoms is formed at an interface between an NiGe layer, being source and drain regions, and a Ge substrate can be formed by the following process. As ions are implanted first in regions in the Ge substrate where the source and drain regions are to be formed. An Ni film is then deposited on these regions and heat treatment is performed. For example, As ions are implanted in the predetermined regions under the condition that acceleration voltage and a dosage level should be about 1 keV and about $2\times10^{14}$ to $1\times10^{15}$ cm$^{-2}$ respectively. An Ni film with a thickness of about 30 nm is then deposited on the predetermined regions. An EB evaporation method in which the evaporation of nickel by an electron beam (EB) is used, a boat evaporation method in which the evaporation of nickel in a boat (made of, for example, tungsten (W)) by heating is used, a sputtering method in which a nickel target is used, or the like can be used for depositing the Ni film. After the Ni film is deposited, rapid thermal anneal (RTA) treatment is performed in an atmosphere of nitrogen ($N_2$) at a temperature of about 350° C. (time taken to raise the temperature from room temperature to about 350° C. is about 2 minutes) for about 1 minute.

As shown in FIG. 6, both nickel and germanium exist to a certain depth and only germanium exists in a deeper region. A NiGe/Ge junction is formed in a region having approximately this depth. In addition, As concentration peaks at the depth of the NiGe/Ge junction and a high-concentration As layer is formed at the junction interface between nickel germanide and germanium by a segregation phenomenon. The segregation layer of As impurity atoms is formed at the junction interface between nickel germanide and germanium in this way.

A structure in which a segregation layer of antimony impurity atoms is formed at a junction interface between nickel germanide and germanium can be formed in the same way. Sb ions are implanted in regions in a Ge substrate where source and drain regions of, for example, an nMOSFET are to be formed. An Ni film is then deposited on these regions and heat treatment is performed. In this case, conditions under which the ion implantation, the deposition of the Ni film, and the heat treatment are performed may be equal to those under which the above segregation layer of arsenic impurity atoms is formed.

As shown in FIG. 7, nickel exists to a certain depth and a NiGe/Ge junction is formed in a region having approximately this depth. A high-concentration Sb layer is formed at the junction interface between nickel germanide and germanium by a segregation phenomenon. The segregation layer of Sb impurity atoms is formed at the junction interface between nickel germanide and germanium in this way.

A structure in which a segregation layer of sulfur atoms is formed at a junction interface between nickel germanide and germanium can also be formed in the same way. S ions are implanted in regions in a Ge substrate where source and drain regions of, for example, an nMOSFET are to be formed. An Ni film is then deposited on these regions and heat treatment is performed.

For example, S ions are implanted in the predetermined regions under the condition that acceleration voltage and a dosage level should be about 10 keV and about $5\times10^{13}$ to $1\times10^{15}$ cm$^{-2}$ respectively. An Ni film with a thickness of about 30 nm is then deposited on the predetermined regions by using the EB evaporation method, the boat evaporation method, the sputtering method, or the like. After the Ni film is deposited, RTA treatment is performed in an atmosphere of nitrogen at a temperature of about 350° C. (time taken to raise the temperature from room temperature to about 350° C. is about 2 minutes) for about 1 minute.

As shown in FIG. 8, many nickel atoms exist to a certain depth and a NiGe/Ge junction is formed in a region having approximately this depth. In addition, a high-concentration S layer is formed at the junction interface between nickel germanide and germanium by a segregation phenomenon. The segregation layer of S atoms is formed at the junction interface between nickel germanide and germanium in this way.

In the above descriptions, predetermined atoms are implanted in a Ge substrate, an Ni film is deposited, and heat treatment is performed. By doing so, a NiGe layer is formed and a segregation layer which contains the predetermined atoms is formed at an interface between the NiGe layer and the Ge substrate. However, another method can be used for forming the same structure. For example, a segregation layer can be formed in the following way. An Ni film is deposited first on a Ge substrate. Heat treatment is performed to form a NiGe layer. Predetermined atoms are then implanted in the NiGe layer. Heat treatment is performed to diffuse the atoms. As a result, a segregation layer is formed.

The above conditions under which the NiGe layer is formed are examples. If MOSFETs are formed, conditions under which an NiGe layer is formed can be set properly according to characteristics required. For example, the thickness of a NiGe layer most suitable for a MOSFET depends on the size (minimum gate length) of the transistor and is approximately equal to the extension junction depth ($X_j$) stipulated in the International Roadmap for Semiconductors (ITRS). The thickness of a NiGe layer to be formed should be set with these points taken into consideration.

The thickness of a NiGe layer can be controlled by the thickness of an Ni film deposited first on a Ge substrate or conditions under which RTA treatment is then performed. With a Ni—Ge system, nickel germanide in which the ratio of nickel to germanium is one to one is formed comparatively stably at a temperature between about 200 and 600° C. from the viewpoint of crystallography. In the above examples, the Ni film with a thickness of about 30 nm is deposited on the Ge substrate and the RTA treatment is performed at a temperature of about 350° C. As a result, a NiGe layer with a thickness of about 60 nm, that is to say, a NiGe layer with a NiGe/Ge junction having a depth of about 60 nm is formed. Predetermined atoms segregate at a junction interface between nickel germanide and germanium and a segregation layer is formed.

To control the thickness of the NiGe layer, the thickness of the Ni film deposited should be controlled in this way. The thickness of the NiGe layer can be controlled by temperature at which the RTA treatment is performed. With the Ni—Ge system, however, nickel and germanium react very sensitively. Accordingly, it is difficult to control the thickness of the NiGe layer by temperature at which the RTA treatment is performed, compared with the case where the thickness of the NiGe layer is controlled by the thickness of the Ni film deposited. Attention must be paid to this point.

To form a high-quality NiGe layer with predetermined thickness by controlling the thickness of the Ni film, it is desirable that the RTA treatment should be performed at a temperature between 200 and 500° C. If the RTA treatment is performed at a temperature below 200° C., then crystallization is insufficient and the resistance of the NiGe layer may increase. If the RTA treatment is performed at a temperature over 500° C., then an island-like structure is apt to be formed on the surface of the NiGe layer by cohesion. As a result, the resistance of the NiGe layer may increase. In this case, a cap film of, for example, titanium nitride (TiN) should be formed on the Ni film deposited on the Ge substrate before the RTA treatment is performed. This prevents cohesion on the surface of the NiGe layer and suppresses an increase in the resistance of the NiGe layer even if the RTA treatment is performed at a temperature over 500° C. The cap film should be removed after the RTA treatment.

The effect of a change in Schottky barrier height by such a segregation layer will now be described.

Figure 9:
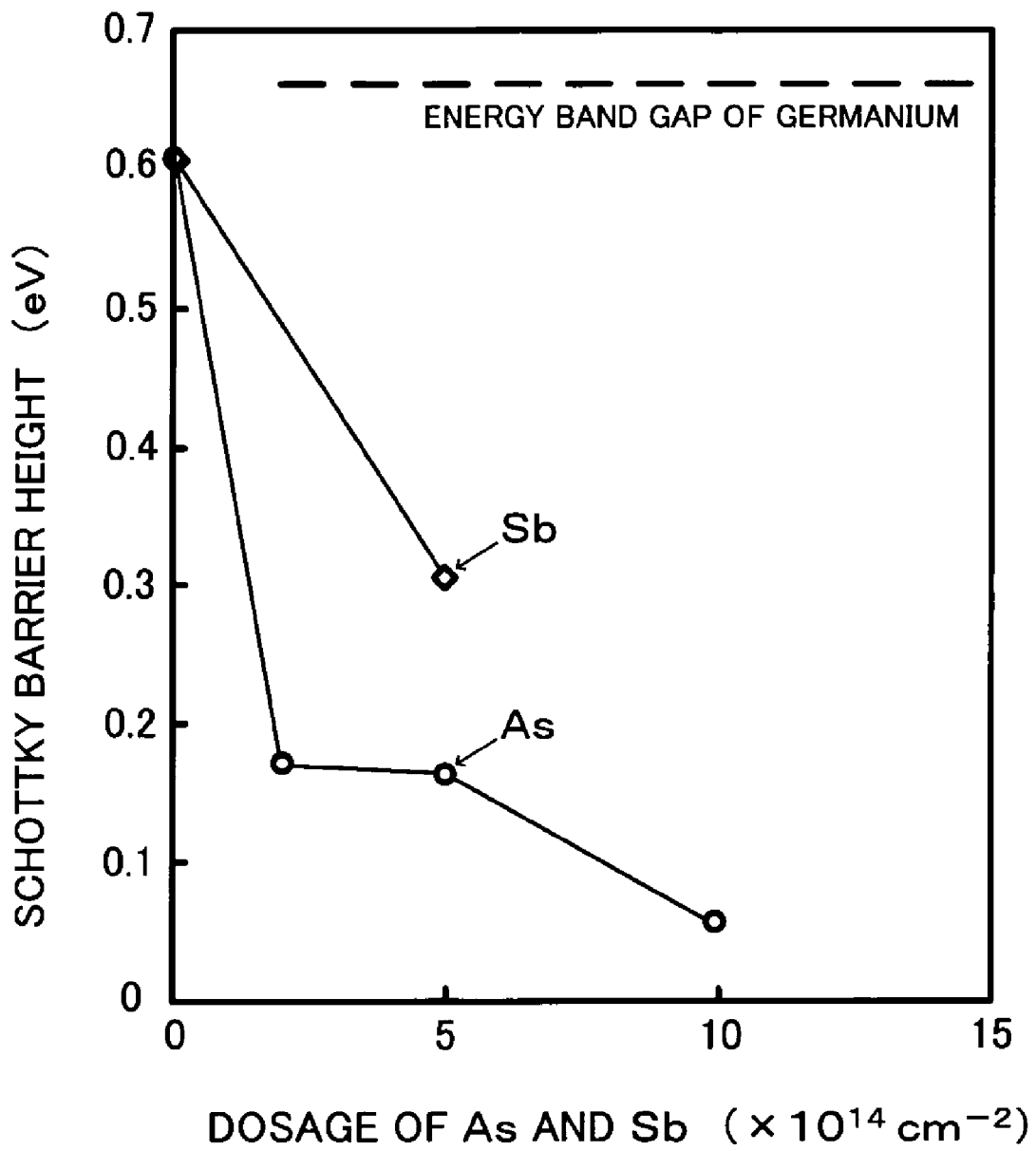
FIG. 9 shows the relationship between the dosage of arsenic or antimony and Schottky barrier height.
Figure 10:
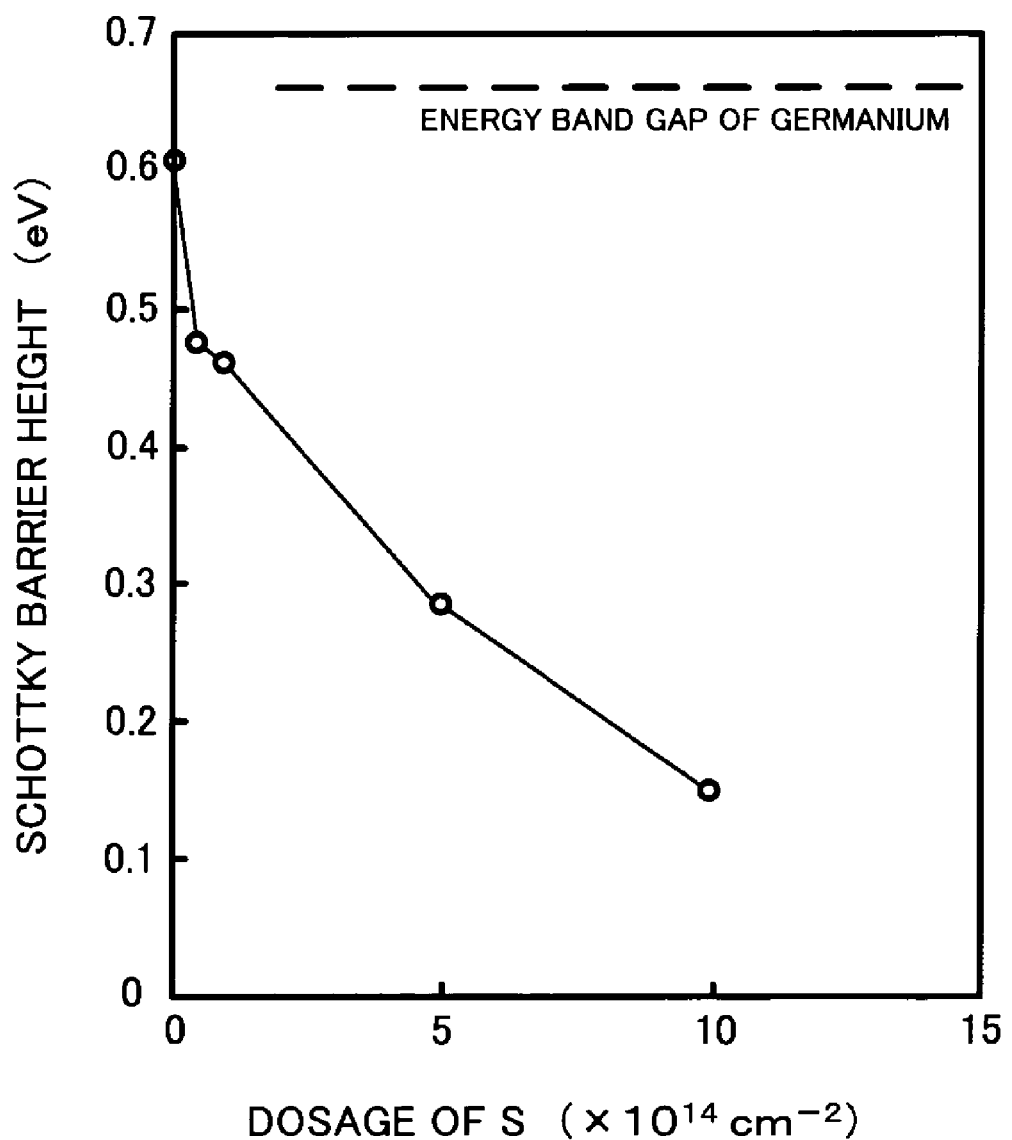
FIG. 10 shows the relationship between the dosage of sulfur and Schottky barrier height.

FIG. 9 shows the relationship between the dosage of arsenic or antimony and Schottky barrier height. FIG. 10 shows the relationship between the dosage of sulfur and Schottky barrier height. In FIGS. 9 and 10, horizontal axes indicate the number ($\times 10^{14}$ cm$^{-2}$) of arsenic, antimony, or sulfur atoms implanted and vertical axes indicate Schottky barrier height (eV). The energy band gap of germanium is also shown in FIGS. 9 and 10.

As shown in FIG. 9, if a segregation layer of arsenic impurity atoms is formed at a junction interface between nickel germanide and germanium, Schottky barrier height shows a tendency to lower with an increase in the dosage of arsenic. As shown in FIG. 9, the same applies to the case where a segregation layer of antimony impurity atoms is formed at a junction interface between nickel germanide and germanium. Similarly, as shown in FIG. 10, if a segregation layer of sulfur atoms is formed at a junction interface between nickel germanide and germanium, Schottky barrier height shows a tendency to lower with an increase in the dosage of sulfur.

As stated above, by forming a segregation layer at a junction interface between nickel germanide and germanium with appropriate atoms, such as arsenic, antimony, or sulfur, Schottky barrier height can be changed to a range suitable for an nMOSFET and be changed over approximately the entire energy band gap of germanium.

The case where Schottky barrier height in an nMOSFET is changed has been described. With a pMOSFET, however, Schottky barrier height can be changed in the same way by using appropriate impurity atoms.

How to fabricate the CMOSFETs 1 shown in FIG. 3 will be described on the basis of the above descriptions. The STI 3, the p-well 11, the n-well 21, the gate insulating films 12 and 22, the gate electrodes 13 and 23, and the sidewalls 14 and 24 are formed first according to an ordinary method.

For example, predetermined ionized atoms are then implanted in regions in the Ge substrate 2 where the source and drain regions of the nMOSFET 10 are to be formed under predetermined conditions. An Ni film with predetermined thickness is deposited on these regions by the sputtering method or the like. Similarly, an Ni film with predetermined thickness is deposited on regions in the Ge substrate 2 where the source and drain regions of the pMOSFET 20 are to be formed by the sputtering method or the like. In this case, the segregation layer 16 is formed only in the nMOSFET 10, so ionized atom implantation for forming a segregation layer is not performed on the pMOSFET 20 side.

If phosphorus, arsenic, antimony, or the like is used as the predetermined atoms for forming the segregation layer 16 in the nMOSFET 10, the ion implantation is performed under the condition that, for example, acceleration voltage and a dosage level should be about 1 keV and about $2 \times 10^{14}$ to $1 \times 10^{15}$ cm$^{-2}$ respectively. If sulfur, selenium, tellurium, or the like is used as the predetermined atoms for forming the segregation layer 16 in the nMOSFET 10, the ion implantation is performed under the condition that, for example, acceleration voltage and a dosage level should be about 10 keV and about $5 \times 10^{13}$ to $1 \times 10^{15}$ cm$^{-2}$ respectively.

The thickness of the Ni film deposited after the ion implantation is, for example, about 15 nm. The EB evaporation method, the boat evaporation method, the sputtering method, or the like can be used for depositing the Ni film. If the mass production of the CMOSFETs 1, the quality of the Ni film, and the like are taken into consideration, it is desirable that the sputtering method which has conventionally been used widely in other processes should be used. In particular, it is desirable that an ultrahigh vacuum sputtering method should be used.

After the Ni film is deposited, heat treatment is performed under predetermined conditions. For example, RTA treatment is performed in an atmosphere of nitrogen at a temperature between about 200 and 500° C. for about 1 minute. In this case, RTA treatment is performed in an atmosphere of nitrogen at a temperature of about 350° C. (time taken to raise the temperature from room temperature to about 350° C. is about 2 minutes) for about 1 minute. As a result, the NiGe layers 15 and 25 with a thickness of about 30 nm are formed. At this time the ionized atoms implanted on the nMOSFET 10 side form the thin high-concentration segregation layer 16 at the junction interface between the NiGe layer 15 and the Ge substrate 2 by a segregation phenomenon.

As a result, the CMOSFETs 1 having the structure shown in FIG. 3 are fabricated and Schottky barrier height suitable for the nMOSFET 10 and the pMOSFET 20 can be realized. After that, an interlayer dielectric film, a wiring, and the like should be formed according to an ordinary method to complete a device.

As stated above, when the segregation layer 16 is formed, the amount of a change in Schottky barrier height can be controlled by the dosage of ions. In addition, the thickness of the NiGe layers 15 and 25, being the source and drain regions, can be controlled by the thickness of the Ni film deposited and temperature at which the heat treatment is performed. When the CMOSFETs 1 are fabricated, the dosage of ions, the thickness of the Ni film, temperature at which heat treatment is performed, or the like should be set according to a target amount of a change in Schottky barrier height, target thickness of the NiGe layers 15 and 25, or the like. In the above example, the thickness of the NiGe layers 15 and 25, that is to say, the depth of the NiGe/Ge junction is set to about 30 nm, so the thickness of the Ni film deposited before the RTA treatment is about 15 nm. As described above, the thickness of the NiGe layers 15 and 25 can also be controlled by temperature at which the RTA treatment is performed after the deposition of the Ni film. With the Ni—Ge system, however, nickel and germanium react very sensitively. Accordingly, it is difficult to control the thickness of the NiGe layers 15 and 25 by temperature at which the RTA treatment is performed, compared with the case where the thickness of the NiGe layers 15 and 25 is controlled by the thickness of the Ni film deposited. Attention must be paid to this point.

As stated above, the segregation layer 16 may be formed by performing ion implantation on the NiGe layer 15 after the formation of the NiGe layers 15 and 25.

As has been described in the foregoing, in the CMOSFETs 1 having the above structure, channel regions in the nMOSFET 10 and the pMOSFET 20 are germanium and the segregation layer 16 of predetermined atoms is formed at the junction interface between the NiGe layer 15 and the Ge substrate 2 in the nMOSFET 10. As a result, Schottky barrier height suitable for the nMOSFET 10 and the pMOSFET 20 can be realized and the high-speed CMOSFETs 1 can be fabricated.

As stated above, the segregation layer 16 may be formed only in the rMOSFET 10 in order to obtain Schottky barrier height suitable for the nMOSFET 10 and the pMOSFET 20. In order to obtain Schottky barrier height suitable for the nMOSFET 10 and the pMOSFET 20, however, a segregation layer may be formed both in the nMOSFET 10 and in the pMOSFETs 20 as occasion arises.

Figure 11:
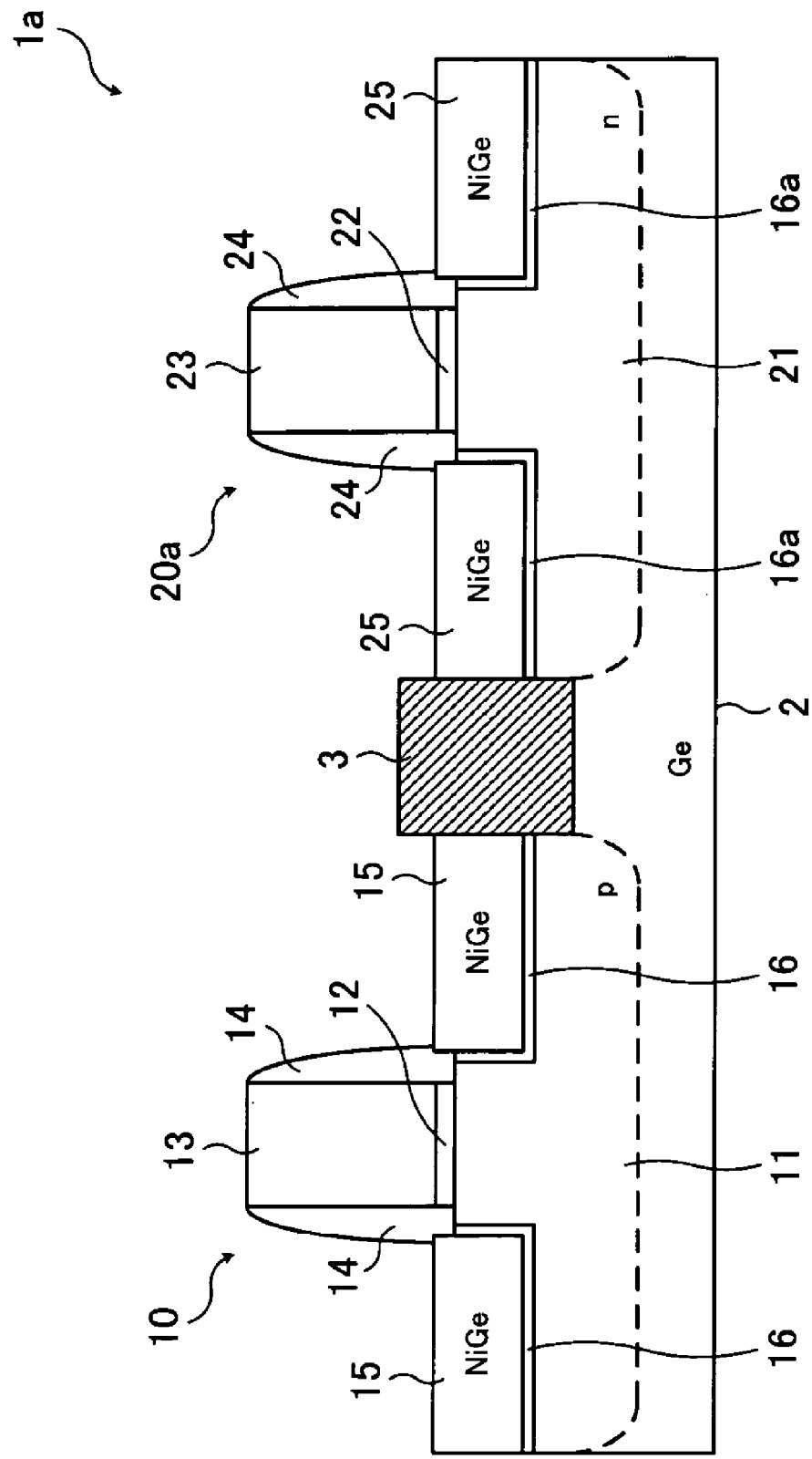
FIG. 11 shows CMOSFETs having another structure.

FIG. 11 shows CMOSFETs having another structure. Components in FIG. 11 that are the same as those shown in FIG. 3 are marked with the same symbols and detailed descriptions of them will be omitted.

CMOSFETs 1a shown in FIG. 11 differs from the CMOSFETs 1 shown in FIG. 3 in that a segregation layer 16a is formed at a junction interface between an NiGe layer 25 and a Ge substrate 2 in a pMOSFET 20a. The segregation layer 16a is formed by making not only boron, aluminum, gallium, or the like but also sulfur, selenium, tellurium, or the like segregate thinly at high concentration at the junction interface between the NiGe layer 25 and the Ge substrate 2 in the pMOSFET 20a.

With a pMOSFET having a Ge channel, usually Schottky barrier height in the ON state for holes is about 0.06 to 0.1 eV even if a segregation layer 16a is not formed. Accordingly, a pMOSFET with a Ge channel in which a segregation layer is not formed is fully practical. As with the pMOSFET 20a shown in FIG. 11, however, by forming the segregation layer 16a, the Schottky barrier height can be lowered further and the driving capability can be improved further.

The CMOSFETs 1a having the above structure can be fabricated by, for example, the following procedure.

Figure 12:
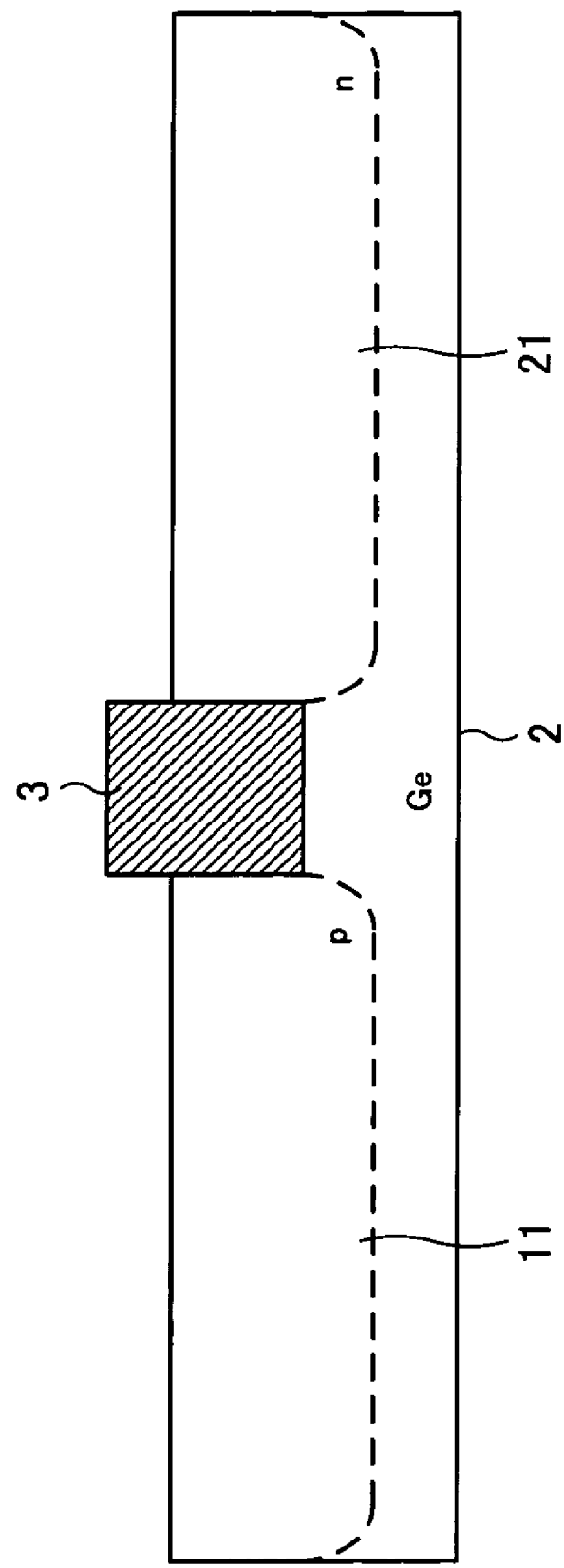
FIG. 12 is a schematic sectional view showing an isolation layer and well formation process.
Figure 13:
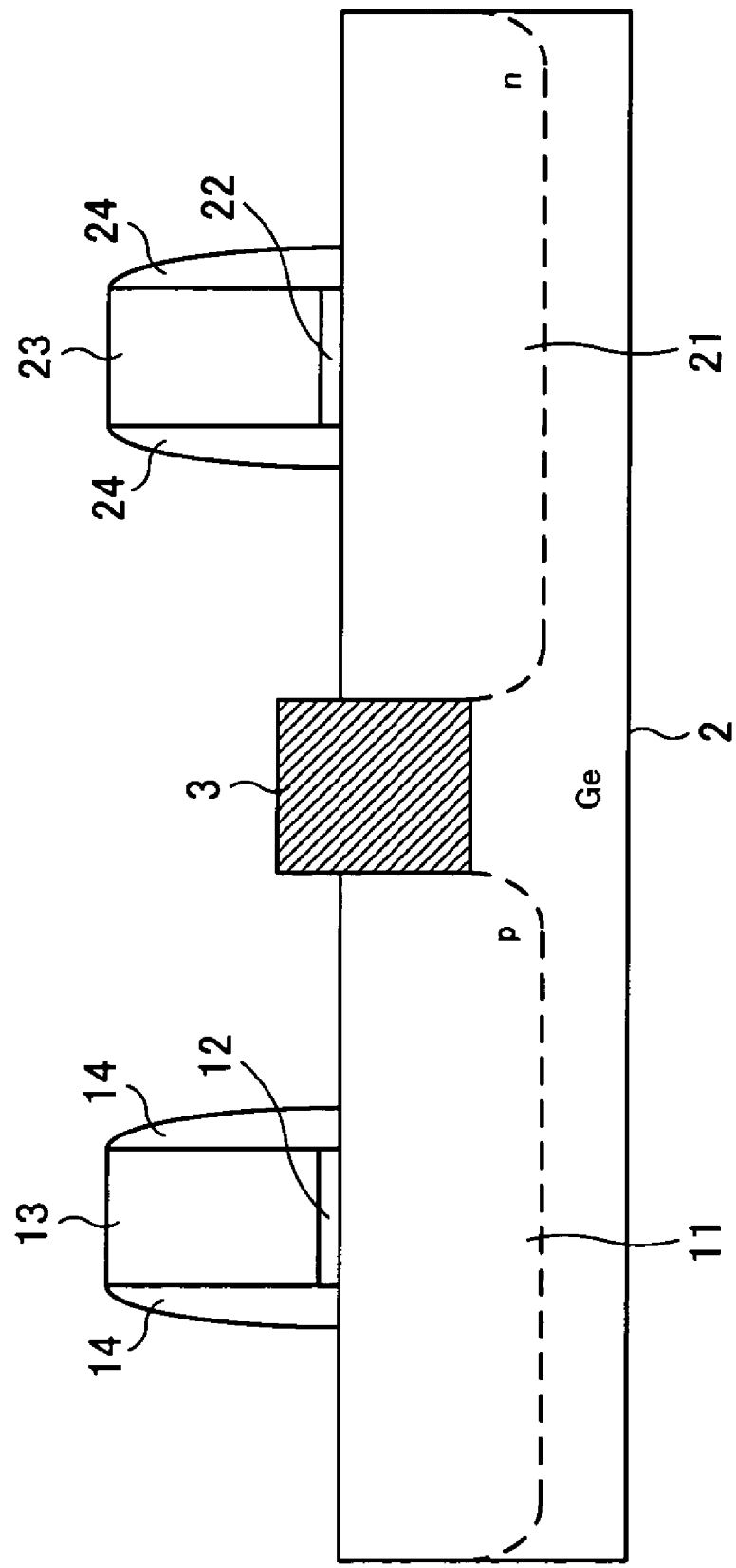
FIG. 13 is a schematic sectional view showing a gate electrode and sidewall formation process.
Figure 14:
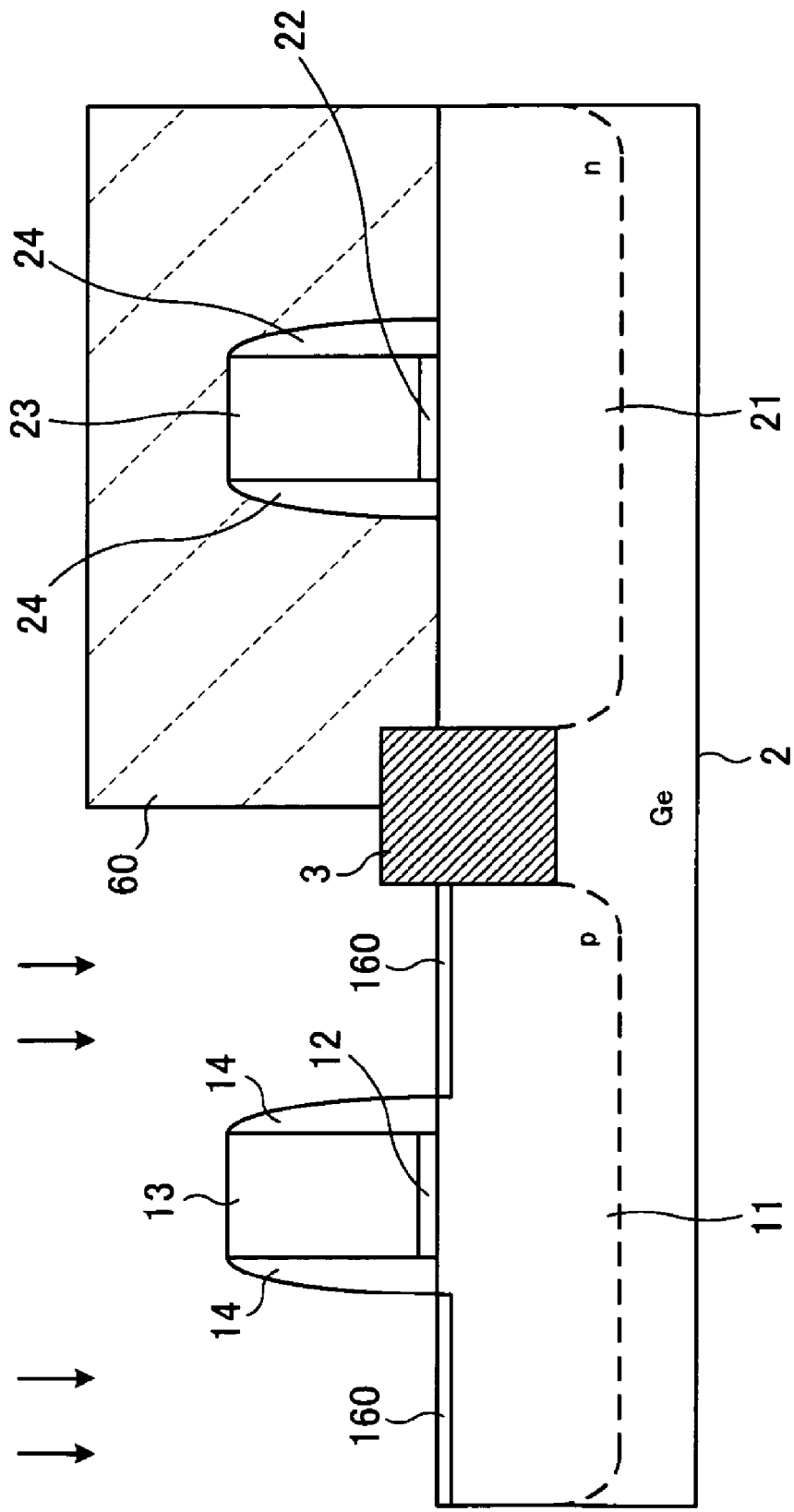
FIG. 14 is a schematic sectional view showing an nMOSFET source and drain region ion implantation process.
Figure 15:
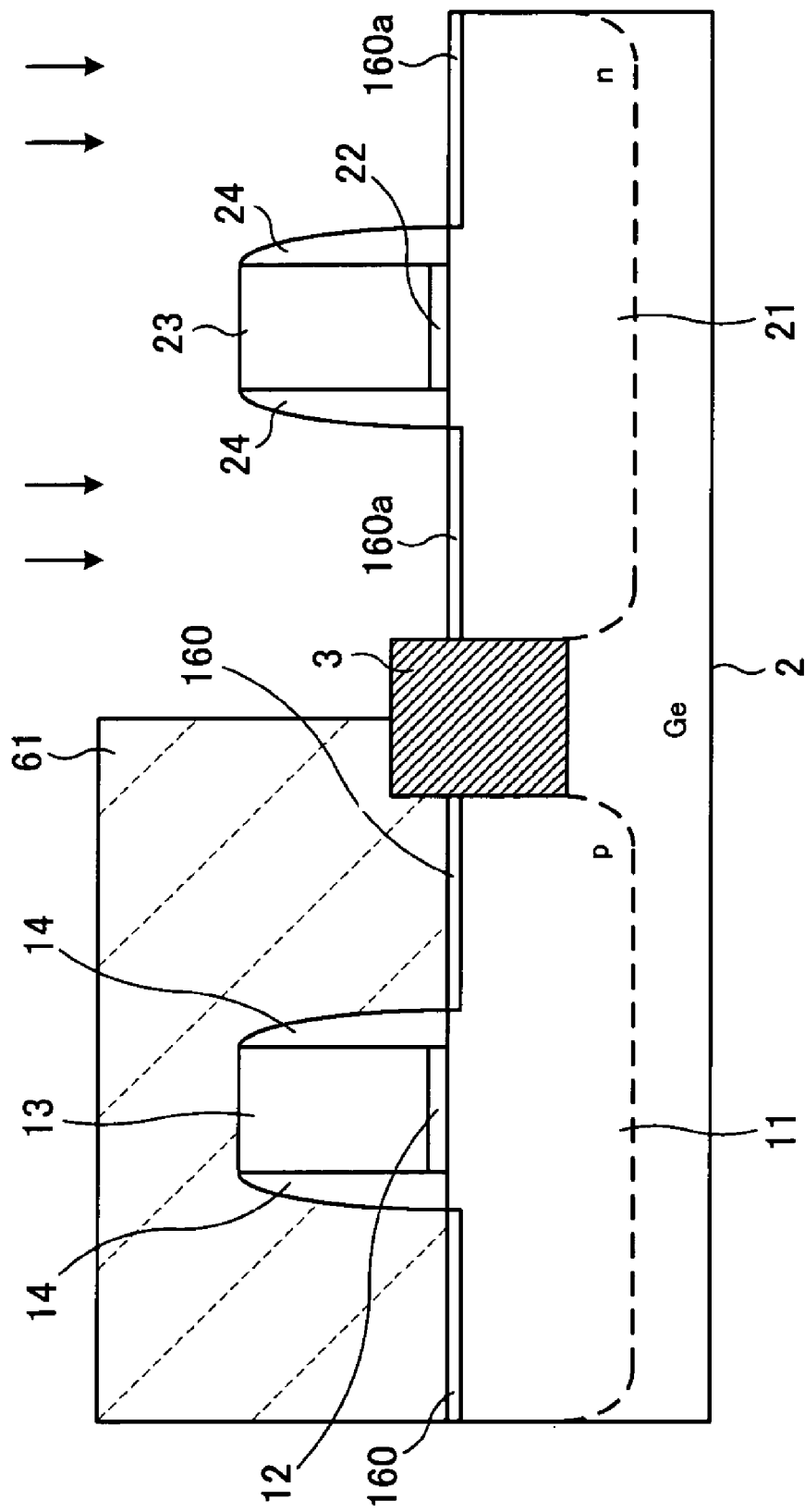
FIG. 15 is a schematic sectional view showing a pMOSFET source and drain region ion implantation process.
Figure 16:
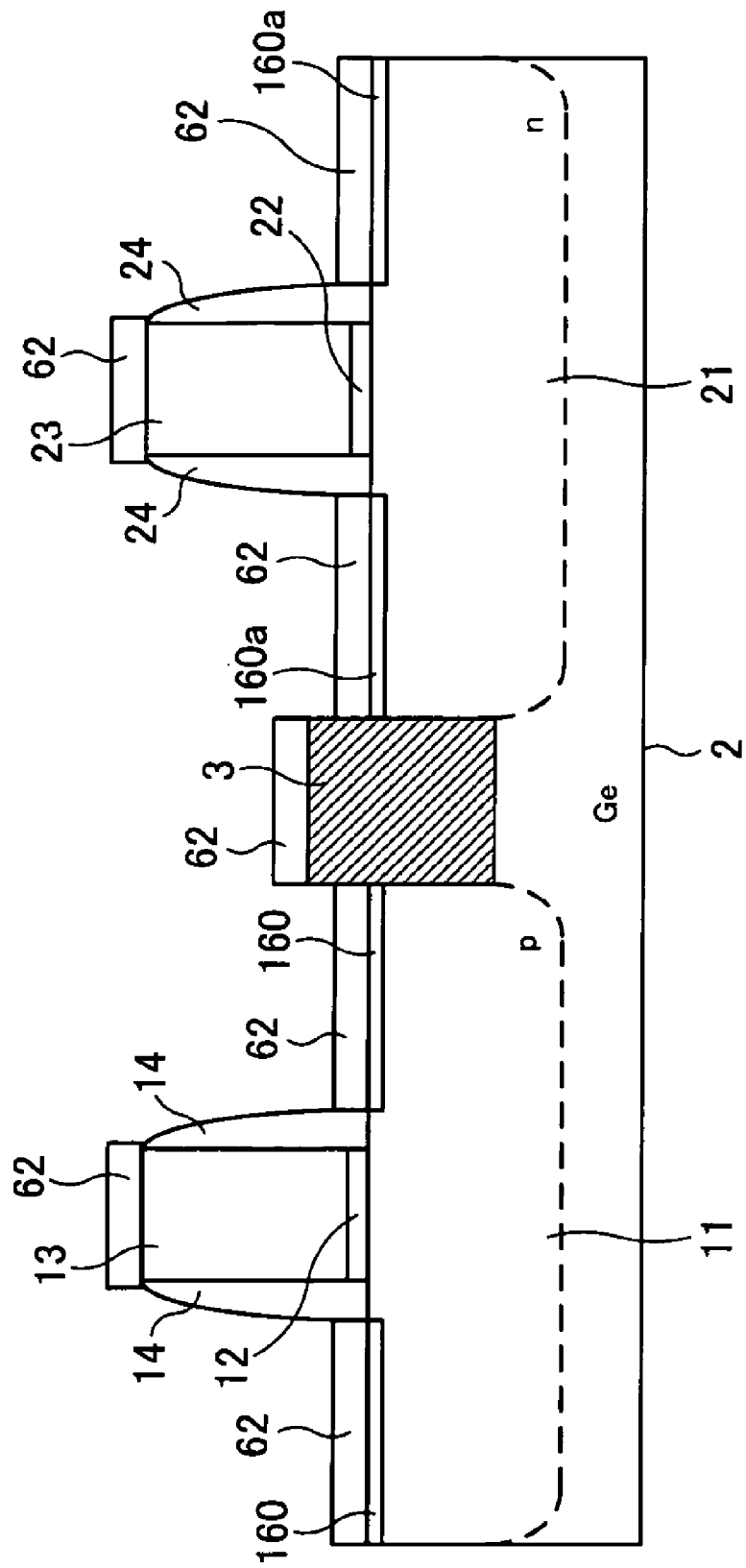
FIG. 16 is a schematic sectional view showing an Ni deposition process.

FIG. 12 is a schematic sectional view showing an isolation layer and well formation process. FIG. 13 is a schematic sectional view showing a gate electrode and sidewall formation process. FIG. 14 is a schematic sectional view showing an nMOSFET source and drain region ion implantation process. FIG. 15 is a schematic sectional view showing a pMOSFET source and drain region ion implantation process. FIG. 16 is a schematic sectional view showing an Ni deposition process.

As shown in FIG. 12, an STI 3 for defining regions where an nMOSFET 10 and the pMOSFET 20a are to be formed is formed first on the Ge substrate 2 in order to fabricate the CMOSFETs 1a having the above structure. Ion implantation is performed on each region defined by the STI 3 at a predetermined dosage level by using impurities of a predetermined conduction type. Activation is then performed by heat treatment. By doing so, a p-well 11 and an n-well 21 are formed.

As shown in FIG. 13, a film of an insulating material, such as GeON, SiO$_2$, SiON, or a high-k insulating film, and a film of an electrode material, such as polycrystalline silicon, are then formed in order on each of the regions where the nMOSFET 10 and the pMOSFET 20a are to be formed. Gate fabrication is performed to form gate insulating films 12 and 22 and gate electrodes 13 and 23. An entire surface is coated with an insulating material. Sidewalls 14 and 24 are formed by an etch-back.

As shown in FIG. 14, the region where the pMOSFET 20a is to be formed is then masked with a resist film 60. Ion implantation is performed on the region where the nMOSFET 10 is to be formed under a predetermined condition by using phosphorus, arsenic, antimony, or the like or sulfur, selenium, tellurium, or the like as first predetermined atoms to form an implanted region 160. The same condition that is used for fabricating the above CMOSFETs 1 can be used for performing the ion implantation. The resist film 60 is removed after the ion implantation.

As shown in FIG. 15, the region where the nMOSFET 10 is to be formed is then masked with a resist film 61. Ion implantation is performed on the region where the pMOSFET 20a is to be formed under a predetermined condition by using boron, aluminum, gallium, or the like or sulfur, selenium, tellurium, or the like as second predetermined atoms to form an implanted region 160a. If boron, aluminum, gallium, or the like is used, then the ion implantation is performed under the condition that, for example, acceleration voltage and a dosage level should be about 1 keV and about $2 \times 10^{14}$ to $1 \times 10^{15}$ cm$^{-2}$ respectively. If sulfur, selenium, tellurium, or the like is used, then the ion implantation is performed under the condition that, for example, acceleration voltage and a dosage level should be about 10 keV and about $5 \times 10^{13}$ to $1 \times 10^{15}$ cm$^{-2}$ respectively. The resist film 61 is removed after the ion implantation.

As shown in FIG. 16, an Ni film 62 with a thickness of about 15 nm is then deposited on an entire surface. After the Ni film 62 is deposited, RTA treatment is performed in an atmosphere of nitrogen at a temperature of about 350° C. (time taken to raise the temperature from room temperature to about 350° C. is about 2 minutes) for about 1 minute to make the Ni film 62 and the Ge substrate 2 react. A portion of the Ni film 62 which has not reacted yet is then removed. As shown in FIG. 11, by doing so, the NiGe layers 15 and 25 with a thickness of about 30 nm are formed. In this case, atoms in the implanted region 160 are pressed by nickel germanide which is in the process of reaction, and segregate at a junction (first junction) interface between the NiGe layer 15 and the Ge substrate 2. As a result, the segregation layer 16 (first layer which contains the first predetermined atoms) is formed at a junction (first junction) interface between the NiGe layer 15 and the Ge substrate 2. Similarly, atoms in the implanted region 160a are pressed by nickel germanide which is in the process of reaction, and segregate at a junction (second junction) interface between the NiGe layer 25 and the Ge substrate 2. As a result, the segregation layer 16a (second layer which contains the second predetermined atoms) is formed at the junction (second junction) interface between the NiGe layer 25 and the Ge substrate 2. After that, an interlayer dielectric film, a wiring, and the like should be formed according to an ordinary method to complete a device.

If an intermetallic compound which contains germanium is formed in a Ge substrate as source and drain regions, usually Schottky barrier height for holes is low and Schottky barrier height for electrons is high. Accordingly, as with the CMOSFETs 1 shown in FIG. 3, the segregation layer 16 is formed in the nMOSFET 10. By doing so, Schottky barrier height for electrons can be lowered in the nMOSFET 10 and the driving capability of the nMOSFET 10 can be improved. As stated above, the pMOSFET 20a has practical performance even if the segregation layer 16a is not formed. By forming the segregation layer 16a in the pMOSFET 20a in the above way, however, Schottky barrier height for holes can be lowered further and the driving capability of the pMOSFET 20a can be improved further.

In the procedure for fabricating the CMOSFETs 1a shown in FIGS. 12 through 16, if after the implantation of ions in the region where the nMOSFET 10 is to be formed and the removal of the resist film 60 shown in FIG. 14, the Ni film 62 is formed on an entire surface and RTA treatment is performed instead of the implantation of ions in the region where the pMOSFET 20a is to be formed shown in FIG. 15, then the CMOSFETs 1 shown in FIG. 3 are fabricated.

The CMOSFETs 1a shown in FIG. 11 can be fabricated by the following procedure other than the above. In this procedure, the same processes that are shown in FIGS. 12 and 13 are performed. Accordingly, processes performed after them will mainly be described.

Figure 17:
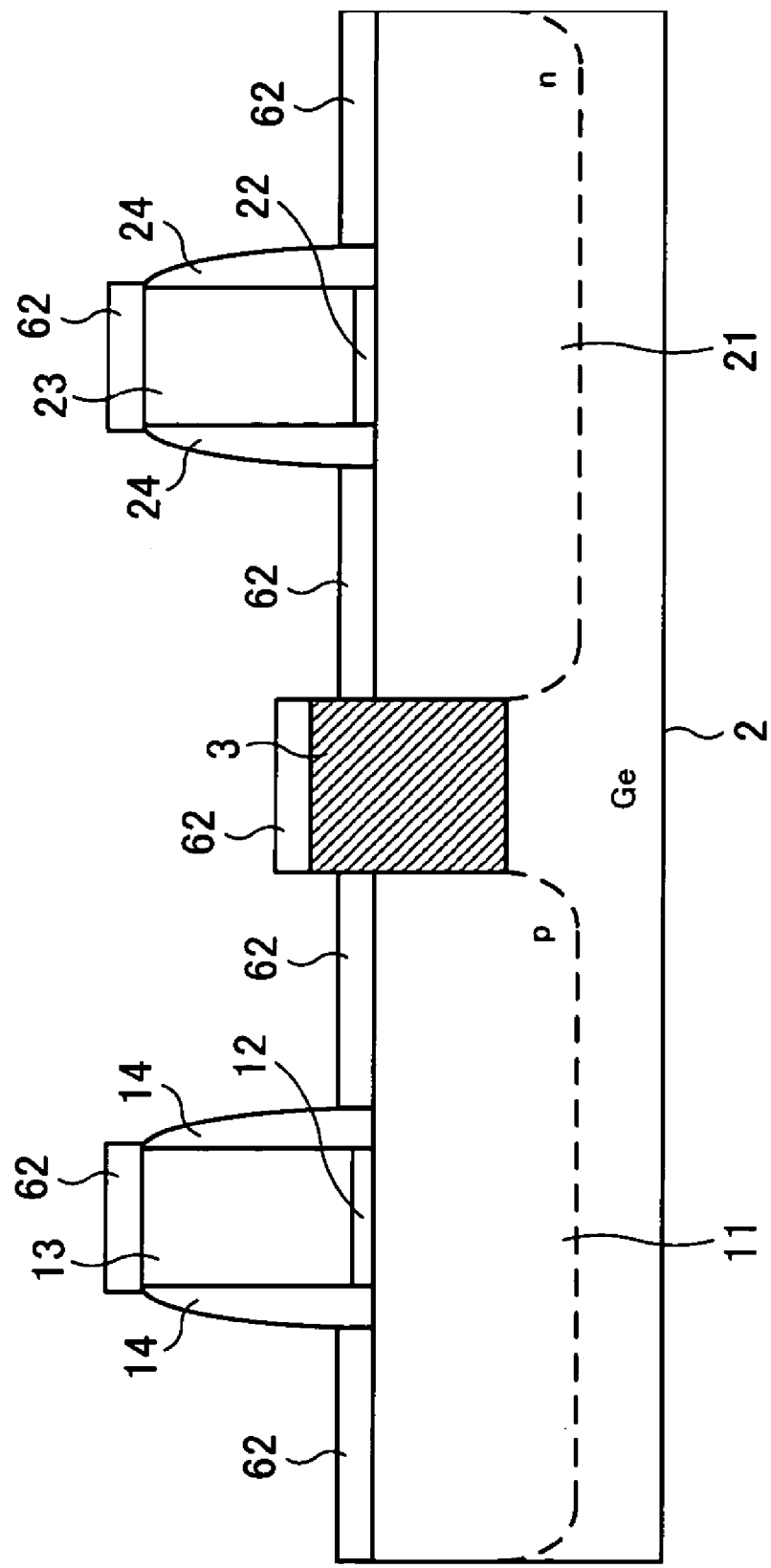
FIG. 17 is a schematic sectional view showing an Ni deposition process in another method for fabricating the CMOSFETs.
Figure 18:
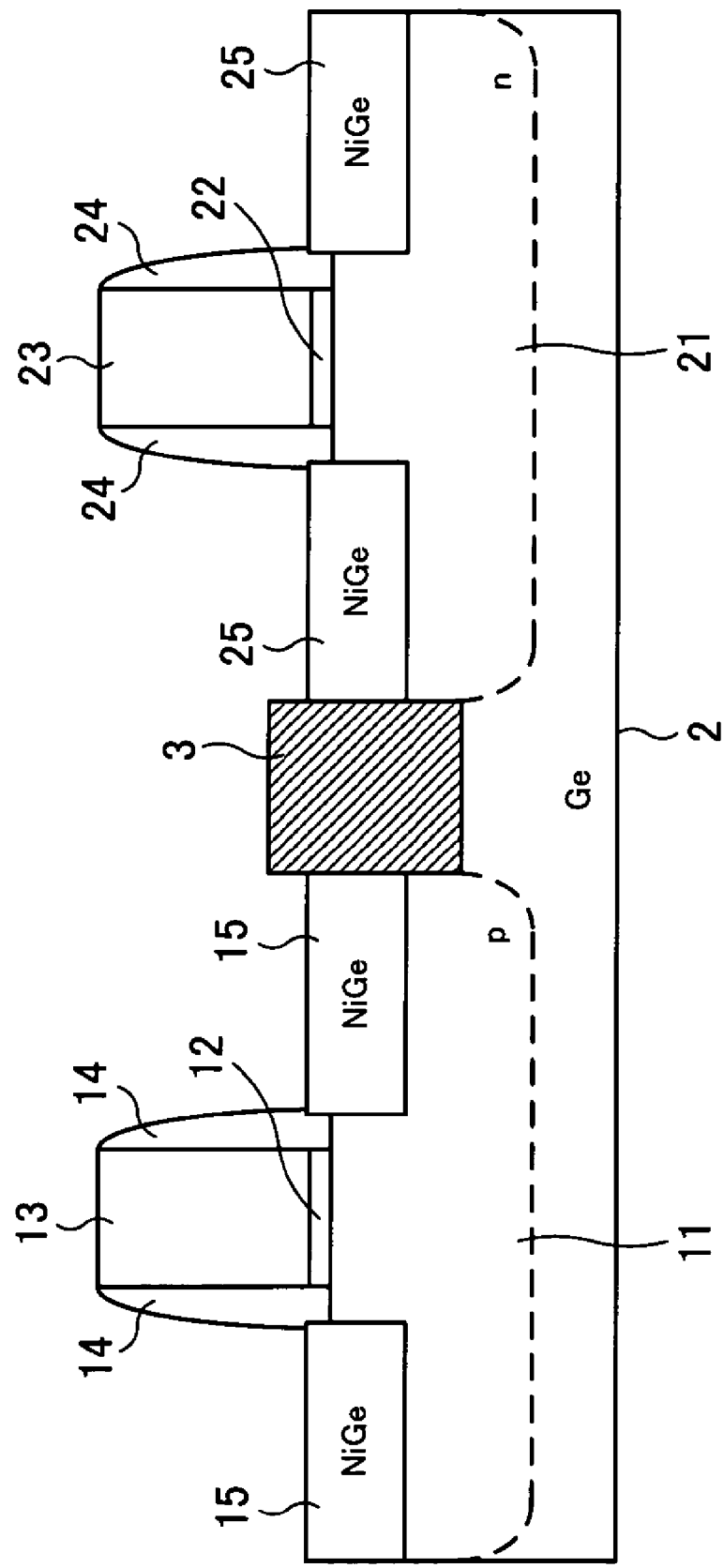
FIG. 18 is a schematic sectional view showing an RTA treatment process in another method for fabricating the CMOSFETs.
Figure 19:
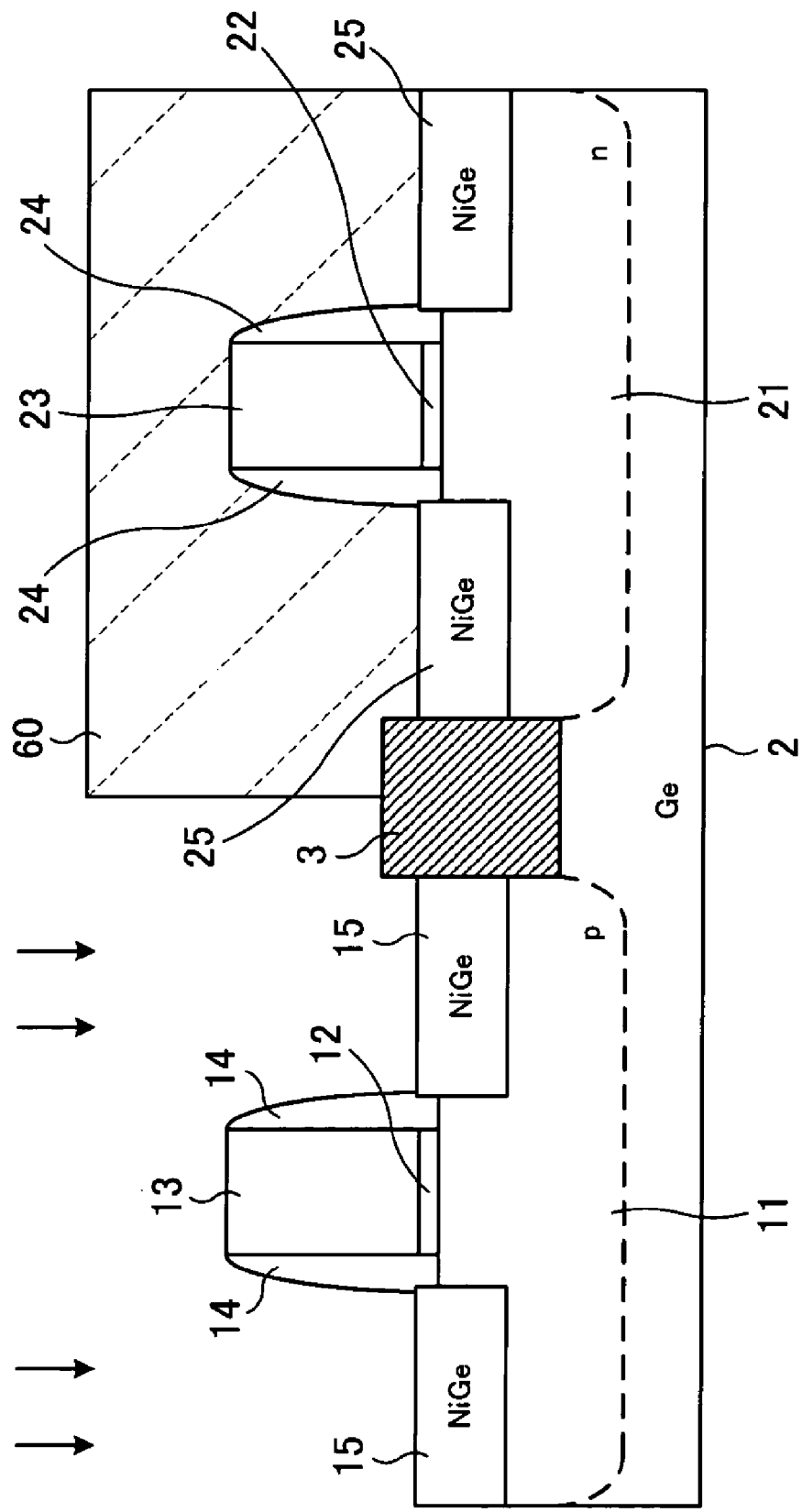
FIG. 19 is a schematic sectional view showing an nMOSFET source and drain region ion implantation process in another method for fabricating the CMOSFETs.
Figure 20:
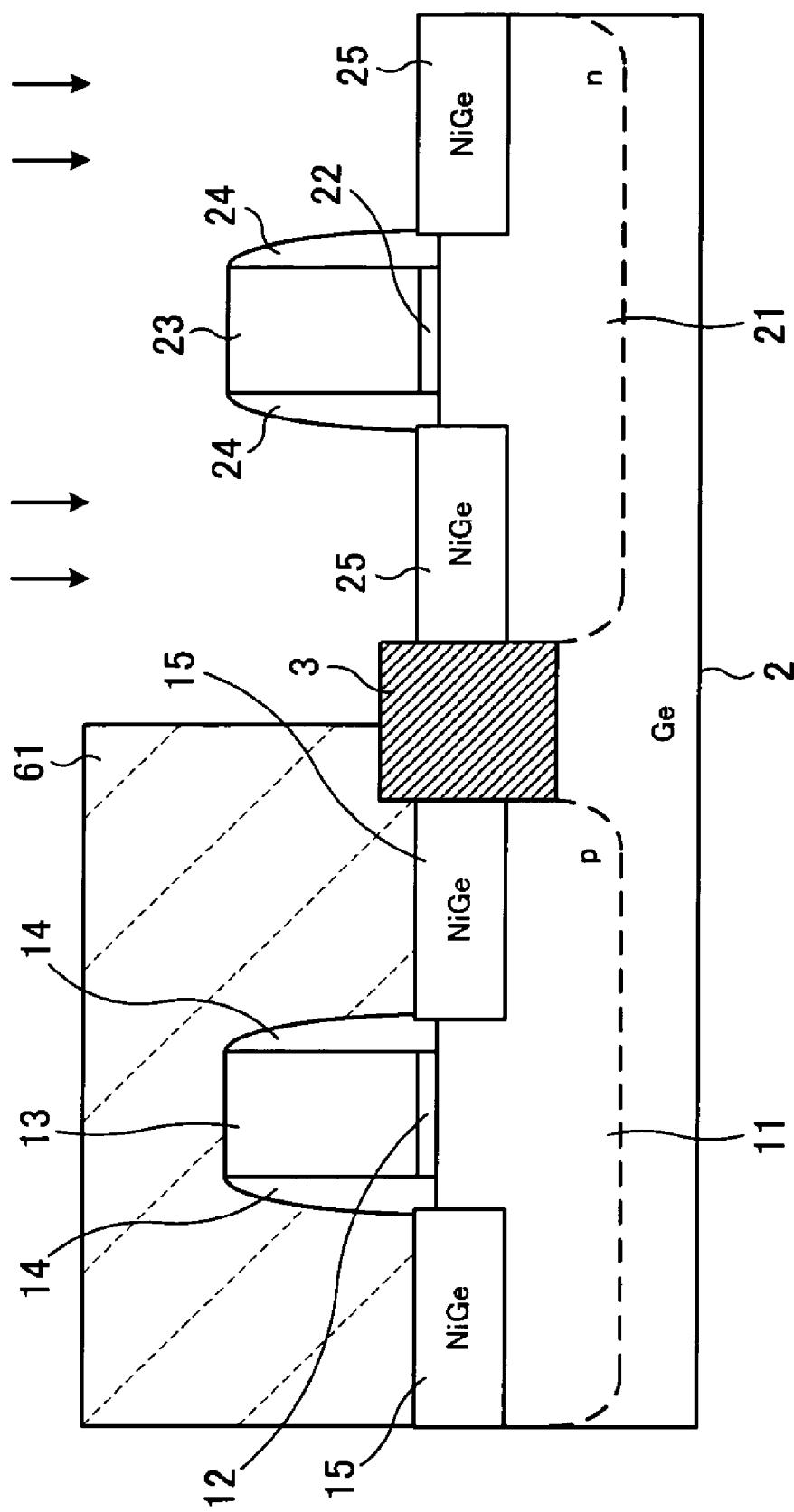
FIG. 20 is a schematic sectional view showing a pMOSFET source and drain region ion implantation process in another method for fabricating the CMOSFETs.

FIG. 17 is a schematic sectional view showing an Ni deposition process in another method for fabricating the CMOSFETs. FIG. 18 is a schematic sectional view showing an RTA treatment process in another method for fabricating the CMOSFETs. FIG. 19 is a schematic sectional view showing an nMOSFET source and drain region ion implantation process in another method for fabricating the CMOSFETs. FIG. 20 is a schematic sectional view showing a pMOSFET source and drain region ion implantation process in another method for fabricating the CMOSFETs. Components in FIGS. 17 through 20 that are the same as those shown in FIGS. 11 through 16 are marked with the same symbols and detailed descriptions of them will be omitted.

First, as shown in FIG. 12, an STI 3 is formed and a p-well 11 and an n-well 21 are formed. As shown in FIG. 13, gate insulating films 12 and 22, gate electrodes 13 and 23, and sidewalls 14 and 24 are then formed.

As shown in FIG. 17, an Ni film 62 with a thickness of about 15 nm is then deposited on an entire surface. As shown in FIG. 18, RTA treatment is then performed under predetermined conditions to form NiGe layers 15 and 25 with predetermined thickness (about 30 nm, for example). A portion of the Ni film 62 which has not reacted yet is removed.

As shown in FIG. 19, after the NiGe layers 15 and 25 are formed in this way, a region where a pMOSFET 20a is to be formed is then masked with a resist film 60. Ion implantation is performed on a region where an nMOSFET 10 is to be formed under a predetermined condition by using phosphorus, arsenic, antimony, or the like or sulfur, selenium, tellurium, or the like. The resist film 60 is removed after the ion implantation.

As shown in FIG. 20, the region where the nMOSFET 10 is to be formed is then masked with a resist film 61. Ion implantation is performed on the region where the pMOSFET 20a is to be formed under a predetermined condition by using boron, aluminum, gallium, or the like or sulfur, selenium, tellurium, or the like. The resist film 61 is removed after the ion implantation.

Finally, RTA treatment is performed under predetermined conditions to make ionized atoms implanted diffuse and segregate. By doing so, a segregation layer 16 is formed at a junction interface between the NiGe layer 15 and a Ge substrate 2 and a segregation layer 16a is formed at a junction interface between the NiGe layer 25 and the Ge substrate 2. The ionized atoms implanted have a higher diffusion coefficient in the NiGe layers 15 and 25 than in the Ge substrate 2. Therefore, the ionized atoms implanted after the formation of the NiGe layers 15 and 25 diffuse into the NiGe layers 15 and 25 and form the segregation layers 16 and 16a.

As stated above, in this procedure the ion implantation for forming the segregation layers 16 and 16a is performed after the formation of the NiGe layers 15 and 25. In this case, a high acceleration voltage can be set at ion implantation time, compared with the case where ion implantation for forming the segregation layers 16 and 16a is performed before the formation of the NiGe layers 15 and 25 (see FIGS. 12 through 16). This enables the use of, for example, an ion implanter in which the lowest limit of acceleration voltage is high. That is to say, there is a vast selection of systems to choose from. Moreover, in this procedure the segregation layers 16 and 16a can be formed by making use of the difference between the diffusion coefficients of the ionized atoms implanted in the NiGe layers 15 and 25 and the Ge substrate 2. However, when the CMOSFETs 1a are fabricated, enough attention must be paid to the number of atoms which finally remain in the NiGe layers 15 and 25 and the number of atoms which reach the junction interface between the NiGe layer 15 and a Ge substrate 2 and the junction interface between the NiGe layer 25 and the Ge substrate 2. Ionized atoms implanted may remain in the NiGe layers 15 and 25 as long as they do not do damage to the crystal structure.

In the procedure for fabricating the CMOSFETs 1a shown in FIGS. 12, 13, and 17 through 20, if, after the implantation of ions in the region where the nMOSFET 10 is to be formed and the removal of the resist film 60 shown in FIG. 19, RTA treatment is performed under predetermined conditions instead of the implantation of ions in the region where the pMOSFET 20a is to be formed shown in FIG. 20, then the CMOSFETs 1 shown in FIG. 3 are fabricated.

In the above examples, the Ge substrate is used for fabricating the CMOSFETs. However, a germanium on insulator (GOI) substrate can be used in place of Ge substrate for fabricating CMOSFETs.

Figure 21:
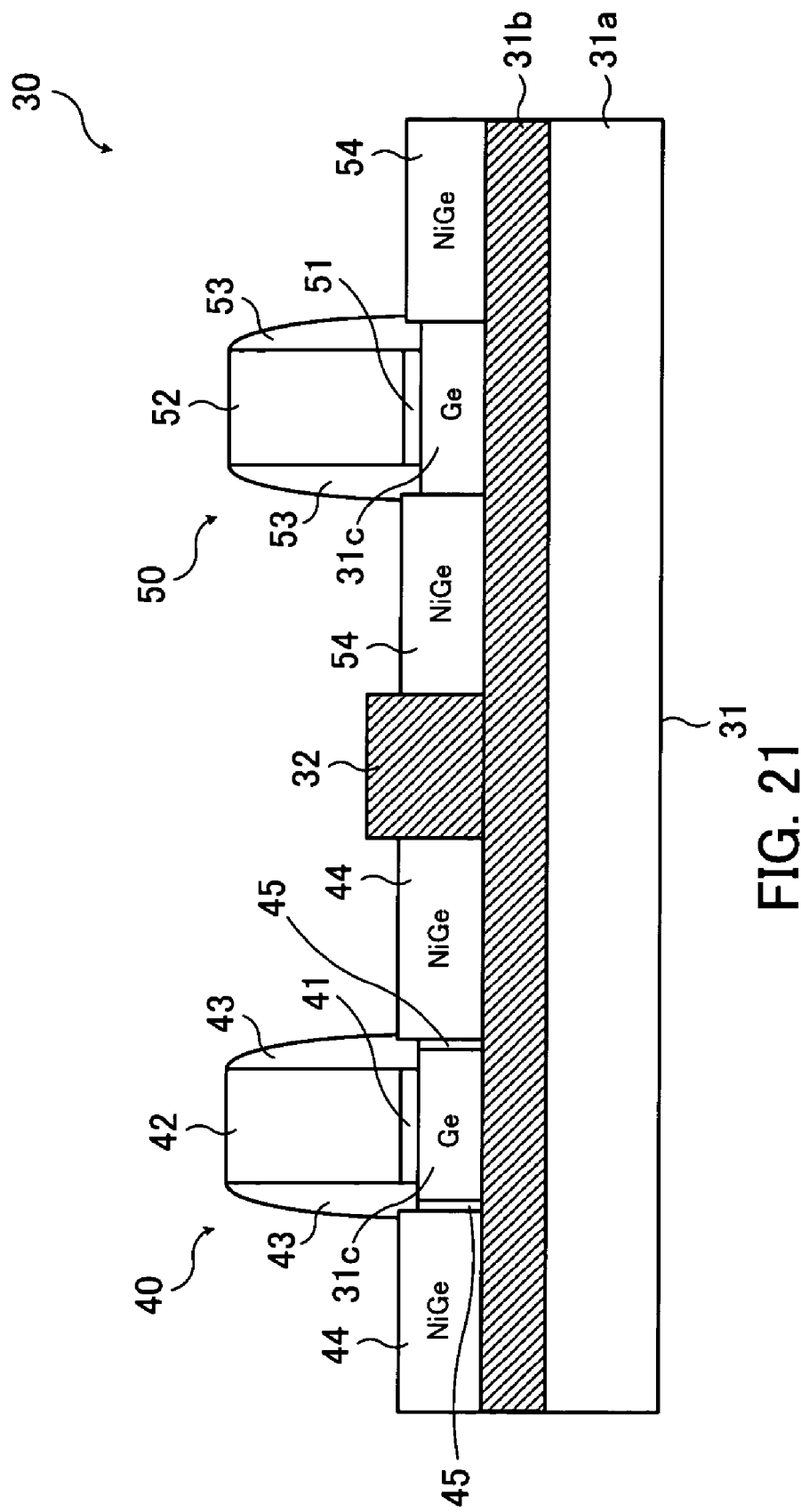
FIG. 21 shows an example of a method for fabricating CMOSFETs by using a GOI substrate.

FIG. 21 shows an example of a method for fabricating CMOSFETs by using a GOI substrate.

With CMOSFETs 30 shown in FIG. 21, a GOI substrate 31 formed by forming a thin Ge layer 31c over a supporting substrate 31a, such as an Si substrate, with an insulating film 31b, such as an SiO$_2$ film, between is used. The GOI substrate 31 can be formed by, for example, what is called an oxidation concentration method in which the composition of germanium is increased by oxidizing an SiGe layer formed on a silicon on insulator (SOI) substrate. The thickness of the Ge layer 31c of the GOI substrate 31 is set according to, for example, the required characteristics of the CMOSFETs 30 to be fabricated.

With the CMOSFETs 30, channels are formed in the Ge layer 31c on the GOI substrate 31. That is to say, with an nMOSFET 40, a gate electrode 42 is formed over the Ge layer 31c with a gate insulating film 41 between and a sidewall 43 is formed on the sides of the gate insulating film 41 and the gate electrode 42. An NiGe layer 44 is formed on both sides of the gate electrode 42 on the side of which the sidewall 43 has been formed so as to surround the Ge layer 31c under the gate electrode 42 and the sidewall 43. A very thin segregation layer 45 where predetermined atoms segregate at high concentration is formed at a junction interface between the NiGe layer 44 and the Ge layer 31c.

Similarly, with a pMOSFET 50, a gate electrode 52 is formed over the Ge layer 31c with a gate insulating film 51 between and a sidewall 53 is formed on the sides of the gate insulating film 51 and the gate electrode 52. An NiGe layer 54 is formed on both sides of the gate electrode 52 on the side of which the sidewall 53 has been formed so as to surround the Ge layer 31c under the gate electrode 52 and the sidewall 53.

For example, GeON films formed by performing oxynitriding treatment on the surface of the Ge layer 31c or SiO$_2$ films, SiON films, or high-k insulating films formed on the Ge layer 31c by deposition can be used as the gate insulating films 41 and 51. ZrO$_2$ films, ZrON films, ZrSiO films, ZrSiON films, HfO$_2$ films, HfON films, HfSiO films, HfSiON films, Al$_2$O$_3$ films, HfAlO films, HfAlON films, La$_2$O$_3$ films, or LaAlO films can be used as such high-k insulating films.

The entire transistor structures of the nMOSFET 40 and the pMOSFET 50 are formed above the insulating film 31b and the nMOSFET 40 and the pMOSFET 50 are separated by an STI 32.

With the CMOSFETs 30, the segregation layer 45 is formed at the junction interface between the NiGe layer 44 and the Ge layer 31c in the nMOSFET 40. Accordingly, its Schottky barrier height is properly changed. As a result, with the CMOSFETs 30 Schottky barrier height suitable for the nMOSFET 40 and the pMOSFET 50 is realized.

With the CMOSFETs 30, the transistor structures are formed in the thin Ge layer 31c of the GOI substrate 31. Therefore, effective control can be exercised over channel regions by the gate electrodes 42 and 52, a short channel effect can be suppressed effectively even in the case of minute structures, and high-speed operation can be realized.

The CMOSFETs 30 having the above structure can be fabricated by, for example, the following procedure.

To fabricate the CMOSFETs 30 shown in FIG. 21, the GOI substrate 31 on which the Ge layer 31c with a thickness of, for example, about 30 nm is formed is prepared first. The STI 32 is then formed in the Ge layer 31c. Ions are implanted in the channel regions to adjust thresholds. The gate insulating films 41 and 51, the gate electrodes 42 and 52, and the sidewalls 43 and 53 are formed according to an ordinary method.

For example, predetermined ionized atoms are then implanted in regions in the Ge layer 31c where source and drain regions of the nMOSFET 40 are to be formed under predetermined conditions. In addition, an Ni film with predetermined thickness is deposited on these regions by, for example, the sputtering method. Similarly, an Ni film with predetermined thickness is deposited on regions in the Ge layer 31c where source and drain regions of the pMOSFET 50 are to be formed by, for example, the sputtering method.

If phosphorus, arsenic, antimony, or the like is used as the predetermined atoms for forming the segregation layer 45 in the nMOSFET 40, the ion implantation is performed under the condition that, for example, acceleration voltage and a dosage level should be about 1 keV and about $2 \times 10^{14}$ to $1 \times 10^{15}$ cm$^{-2}$ respectively. If sulfur, selenium, tellurium, or the like is used as the predetermined atoms for forming the segregation layer 45 in the nMOSFET 40, the ion implantation is performed under the condition that, for example, acceleration voltage and a dosage level should be about 10 keV and about $5 \times 10^{13}$ to $1 \times 10^{15}$ cm$^{-2}$ respectively.

The thickness of the Ni film deposited after the ion implantation is, for example, about 15 nm. The EB evaporation method, the boat evaporation method, the sputtering method, or the like can be used for depositing the Ni film. If the mass production of the CMOSFETs 30, the quality of the Ni film, and the like are taken into consideration, it is desirable that the sputtering method should be used. In particular, it is desirable that the ultrahigh vacuum sputtering method should be used.

After the Ni film is deposited, heat treatment is performed under predetermined conditions. For example, heat treatment is performed in an atmosphere of nitrogen at a temperature between about 200 and 500° C. for about 1 minute. As a result, the NiGe layers 44 and 54 with a thickness of about 30 nm which reach the insulating film 31b are formed. At this time the ionized atoms implanted on the nMOSFET 40 side form the thin high-concentration segregation layer 45 at the junction interface between the NiGe layer 44 and the Ge layer 31c by a segregation phenomenon.

As a result, the CMOSFETs 30 having the structure shown in FIG. 21 are fabricated and Schottky barrier height suitable for the nMOSFET 40 and the pMOSFET 50 can be realized. After that, an interlayer dielectric film, a wiring, and the like should be formed according to an ordinary method to complete a device.

With the CMOSFETs 30, when the segregation layer 45 is formed, the amount of a change in Schottky barrier height can be controlled by the dosage of ions. This is the same with the CMOSFETs 1. In the above example, the NiGe layers 44 and 54 are formed so that they will reach the insulating film 31b. However, the thickness of the NiGe layers 44 and 54 can be controlled by the thickness of the Ni film deposited and temperature at which the heat treatment is performed. As described above, however, it is difficult to control the thickness of the NiGe layers 44 and 54 by temperature at which the heat treatment is performed, compared with the case where the thickness of the NiGe layers 44 and 54 is controlled by the thickness of the Ni film deposited. Attention must be paid to this point.

In the above example, the thickness of the Ge layer 31c on the GOI substrate 31 is the same as that of the NiGe layers 44 and 54 to be formed and the NiGe layers 44 and 54 which reach the insulating film 31b are formed by the heat treatment performed after the deposition of the Ni film. By using the GOI substrate 31 on which the Ge layer 31c with such thickness is formed, the thickness of the NiGe layers 44 and 54 can be made equal to that of the Ge layer 31c. Accordingly, even if reaction velocity is high as with an Ni—Ge system, NiGe layers 44 and 54 can be formed with accuracy and the segregation layer 45 can be formed with accuracy.

With the CMOSFETs 30, the following method may be used. After the NiGe layers 44 and 54 are formed, ion implantation is performed on the NiGe layer 44. By doing so, the segregation layer 45 can be formed. This is the same with the CMOSFETs 1.

With CMOSFETs using a GOI substrate, segregation layers may be formed both in an nMOSFET and in a pMOSFET as occasion arises. This is the same with CMOSFETs using a Ge substrate.

Figure 22:
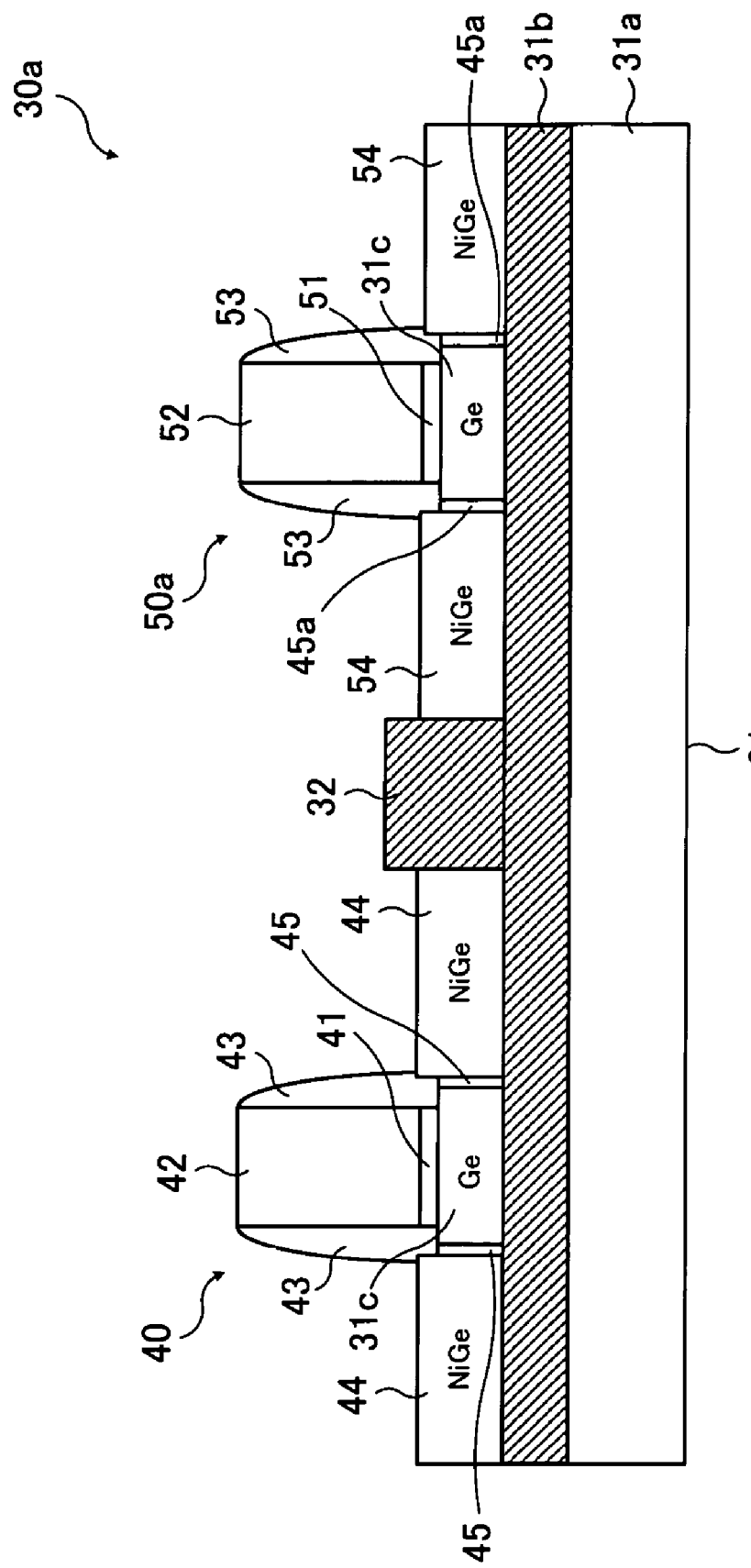
FIG. 22 shows CMOSFETs using a GOI substrate and having another structure.

FIG. 22 shows CMOSFETs using a GOI substrate and having another structure. Components in FIG. 22 that are the same as those shown in FIG. 21 are marked with the same symbols and detailed descriptions of them will be omitted.

CMOSFETs 30a shown in FIG. 22 differ from the above CMOSFETs 30 in that a segregation layer 45a is formed at a junction interface between an NiGe layer 54 and a Ge layer 31c in a pMOSFET 50a. The segregation layer 45a is formed by making not only boron, aluminum, gallium, or the like but also sulfur, selenium, tellurium, or the like segregate thinly at high concentration at the junction interface between the NiGe layer 54 and the Ge layer 31c in the pMOSFET 50a.

As stated above, by not only using a GOI substrate 31 but also forming the segregation layer 45a in the pMOSFET 50a, Schottky barrier height for electrons and holes can be lowered and the driving capability of an nMOSFET 40 and the pMOSFET 50a can be improved further.

The CMOSFETs 30a having the above structure can be fabricated by, for example, the following procedure.

Figure 23:
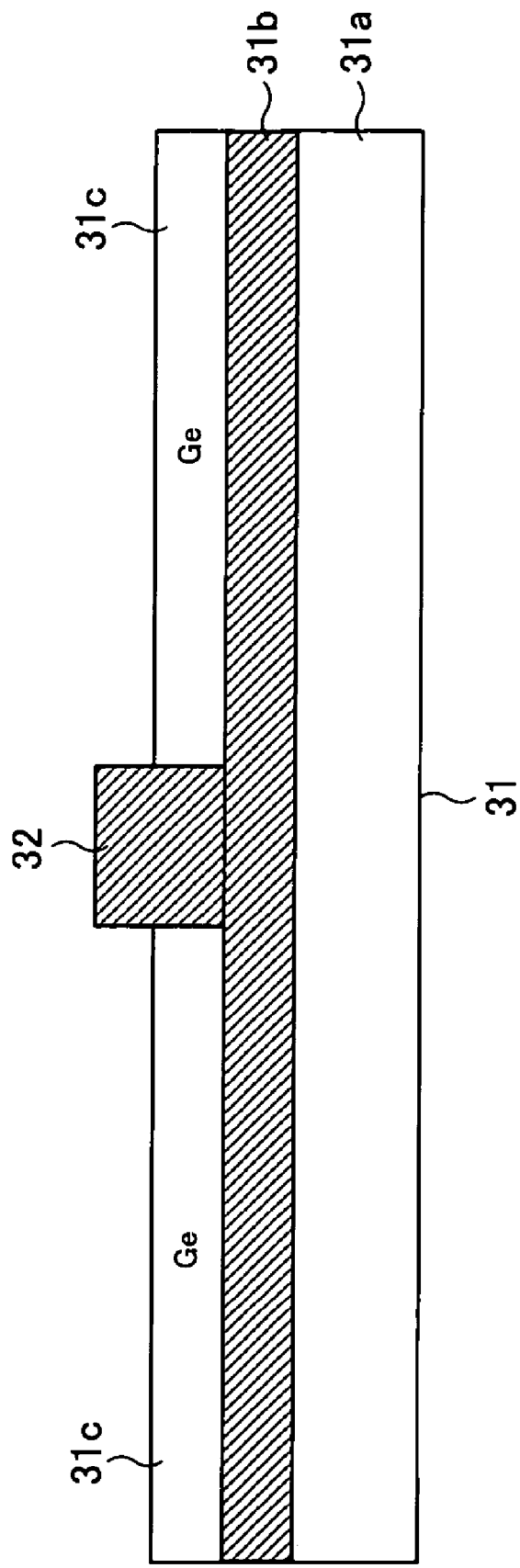
FIG. 23 is a schematic sectional view showing an isolation layer and well formation process performed if a GOI substrate is used.
Figure 24:
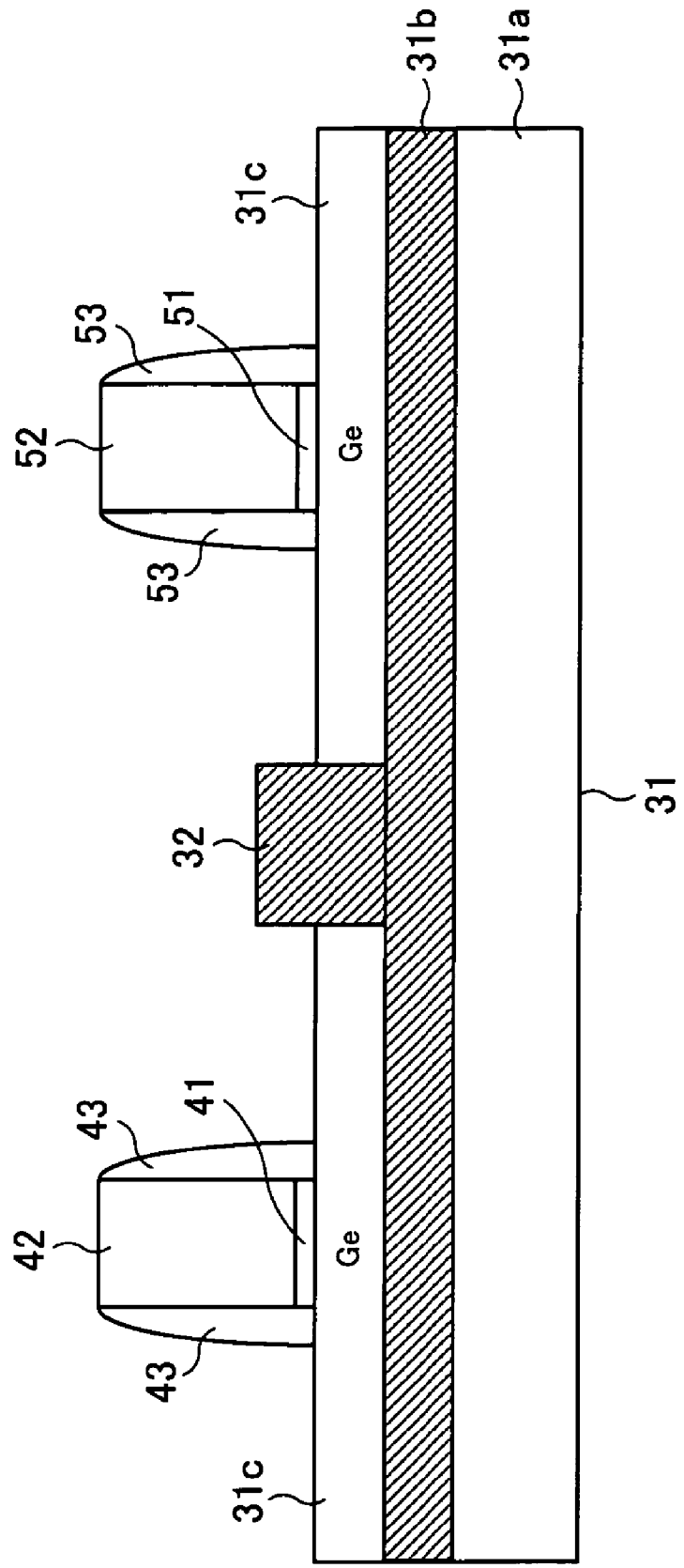
FIG. 24 is a schematic sectional view showing a gate electrode and sidewall formation process performed if the GOI substrate is used.
Figure 25:
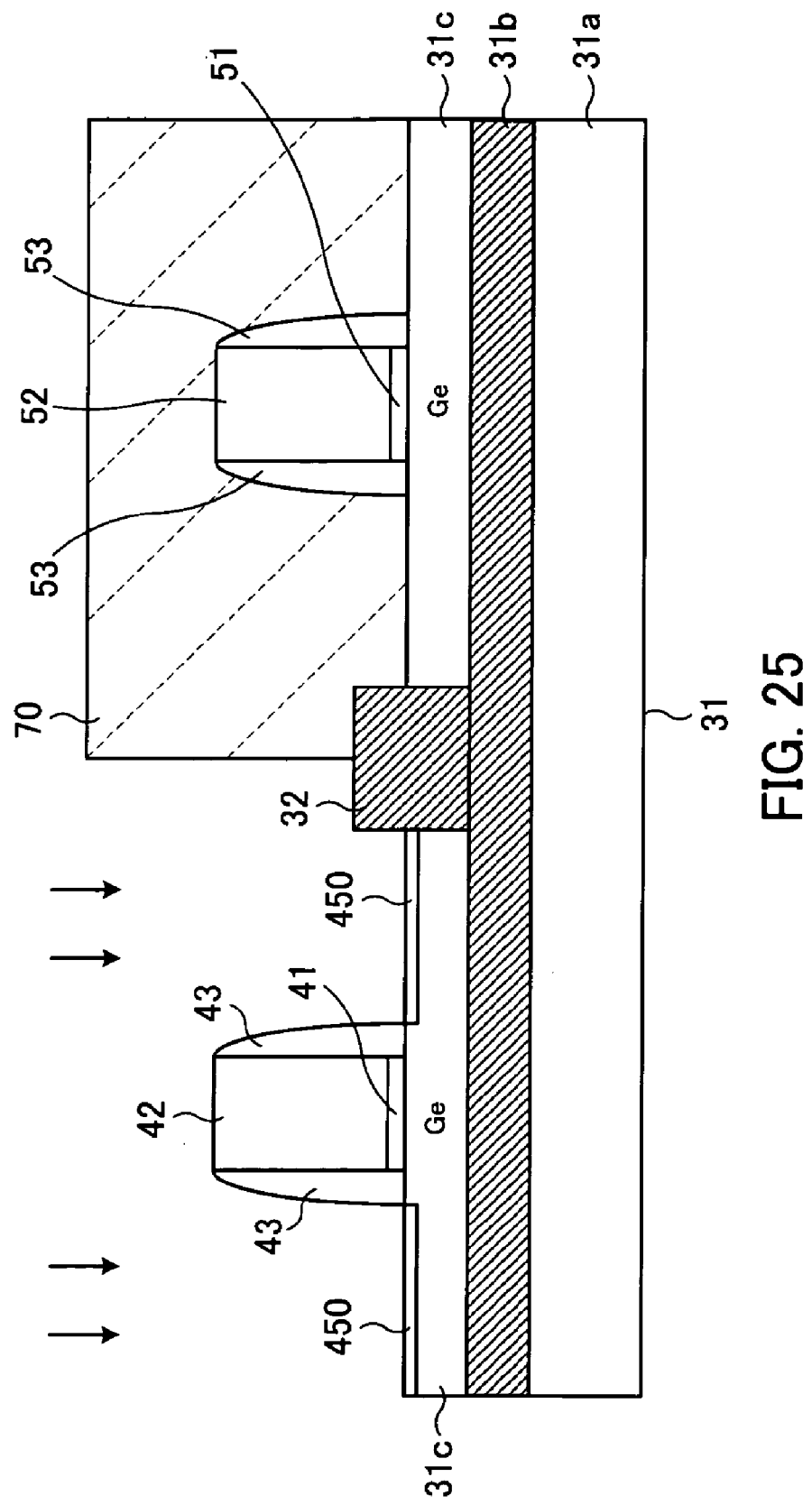
FIG. 25 is a schematic sectional view showing an nMOSFET source and drain region ion implantation process performed if the GOI substrate is used.
Figure 26:
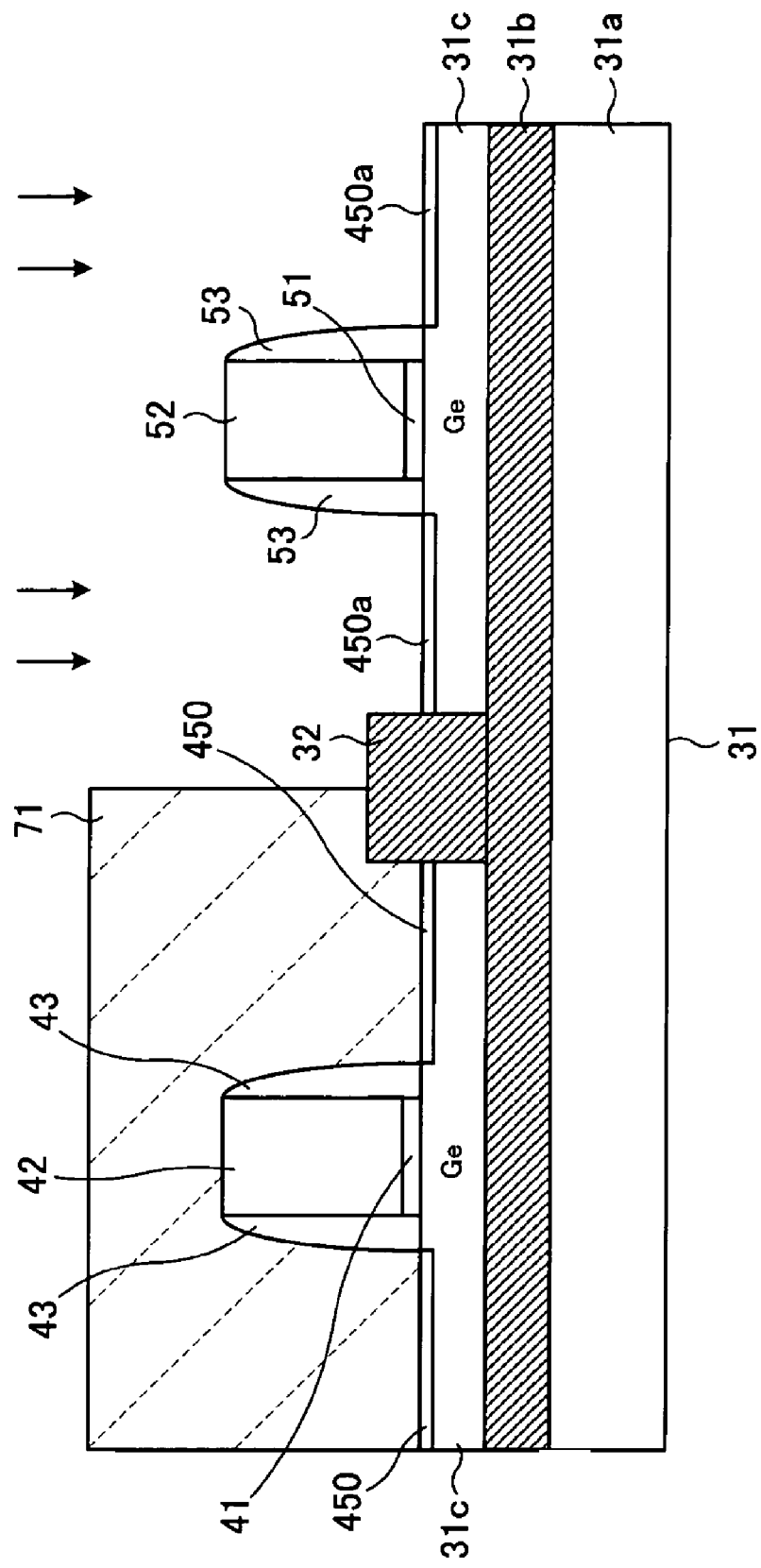
FIG. 26 is a schematic sectional view showing a pMOSFET source and drain region ion implantation process performed if the GOI substrate is used.
Figure 27:
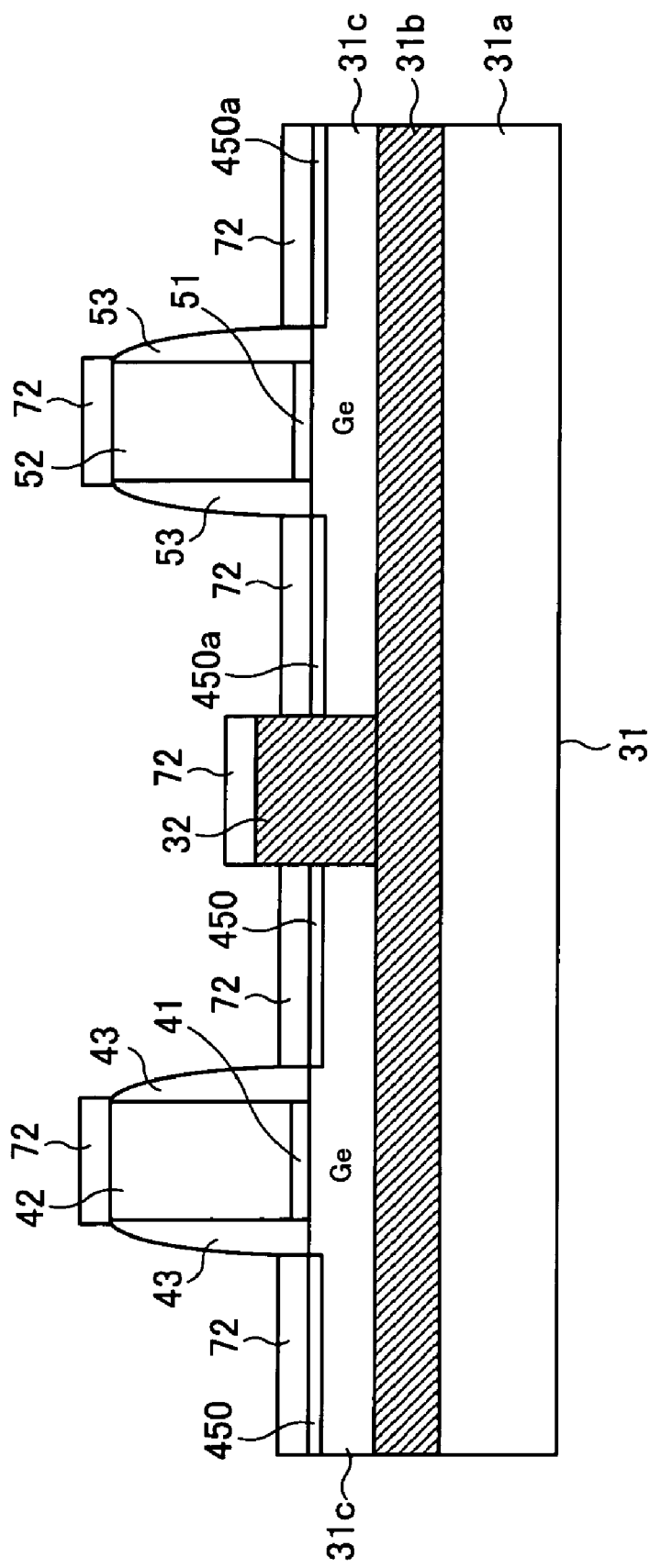
FIG. 27 is a schematic sectional view showing an Ni deposition process performed if the GOI substrate is used.

FIG. 23 is a schematic sectional view showing an isolation layer and well formation process performed if a GOI substrate is used. FIG. 24 is a schematic sectional view showing a gate electrode and sidewall formation process performed if the GOI substrate is used. FIG. 25 is a schematic sectional view showing an nMOSFET source and drain region ion implantation process performed if the GOI substrate is used. FIG. 26 is a schematic sectional view showing a pMOSFET source and drain region ion implantation process performed if the GOI substrate is used. FIG. 27 is a schematic sectional view showing an Ni deposition process performed if the GOI substrate is used.

As shown in FIG. 23, an STI 32 for defining regions where the nMOSFET 40 and the pMOSFET 50a are to be formed is formed first in the Ge layer 31c with a thickness of about 30 nm on the GOI substrate 31 in order to fabricate the CMOSFETs 30a having the above structure. Ion implantation is performed on each region defined by the STI 32 to adjust a threshold.

As shown in FIG. 24, a film of an insulating material, such as $SiO_2$, and a film of an electrode material, such as polycrystalline silicon, are then formed in order on each of the regions where the nMOSFET 40 and the pMOSFET 50a are to be formed. Gate fabrication is performed to form gate insulating films 41 and 51 and gate electrodes 42 and 52. An entire surface is coated with an insulating material. Sidewalls 43 and 53 are formed by an etch-back.

As shown in FIG. 25, the region where the pMOSFET 50a is to be formed is then masked with a resist film 70. Ion implantation is performed on the region where the nMOSFET 40 is to be formed under a predetermined condition by using phosphorus, arsenic, antimony, or the like or sulfur, selenium, tellurium, or the like as first predetermined atoms to form an implanted region 450. The same condition that is used for fabricating the above CMOSFETs 30 can be used for performing the ion implantation. The resist film 70 is removed after the ion implantation.

As shown in FIG. 26, the region where the nMOSFET 40 is to be formed is then masked with a resist film 71. Ion implantation is performed on the region where the pMOSFET 50a is to be formed under a predetermined condition by using boron, aluminum, gallium, or the like or sulfur, selenium, tellurium, or the like as second predetermined atoms to form an implanted region 450a. If boron, aluminum, gallium, or the like is used, then the ion implantation is performed under the condition that, for example, acceleration voltage and a dosage level should be about 1 keV and about $2 \times 10^{14}$ to $1 \times 10^{15}$ $cm^{-2}$ respectively. If sulfur, selenium, tellurium, or the like is used, then the ion implantation is performed under the condition that, for example, acceleration voltage and a dosage level should be about 10 keV and about $5 \times 10^{13}$ to $1 \times 10^5$ $cm^{-2}$ respectively. The resist film 71 is removed after the ion implantation.

As shown in FIG. 27, an Ni film 72 with a thickness of about 15 nm is then deposited on an entire surface. After the Ni film 72 is deposited, RTA treatment is performed in an atmosphere of nitrogen at a temperature of about 350° C. (time taken to raise the temperature from room temperature to about 350° C. is about 2 minutes) for about 1 minute to make the Ni film 72 and the Ge layer 31c react. A portion of the Ni film 72 which has not reacted yet is then removed. As shown in FIG. 22, by doing so, the NiGe layers 44 and 54 with a thickness of about 30 nm which reach an insulating film 31b are formed. In this case, a segregation layer 45 (first layer which contains the first predetermined atoms) is formed at a junction (first junction) interface between the NiGe layer 44 and the Ge layer 31c and the segregation layer 45a (second layer which contains the second predetermined atoms) is formed at a junction (second junction) interface between the NiGe layer 54 and the Ge layer 31c. After that, an interlayer dielectric film, a wiring, and the like should be formed according to an ordinary method to complete a device.

In the procedure for fabricating the CMOSFETs 30a shown in FIGS. 23 through 27, if after the implantation of ions in the region where the nMOSFET 40 is to be formed and the removal of the resist film 70 shown in FIG. 25, the Ni film 72 is formed on an entire surface and RTA treatment is performed instead of the implantation of ions in the region where the pMOSFET 50a is to be formed shown in FIG. 26, then the CMOSFETs 30 shown in FIG. 21 are fabricated.

The CMOSFETs 30a shown in FIG. 22 can be fabricated by the following procedure other than the above. In this procedure, the same processes that are shown in FIGS. 23 and 24 are performed. Accordingly, processes performed after them will mainly be described.

Figure 28:
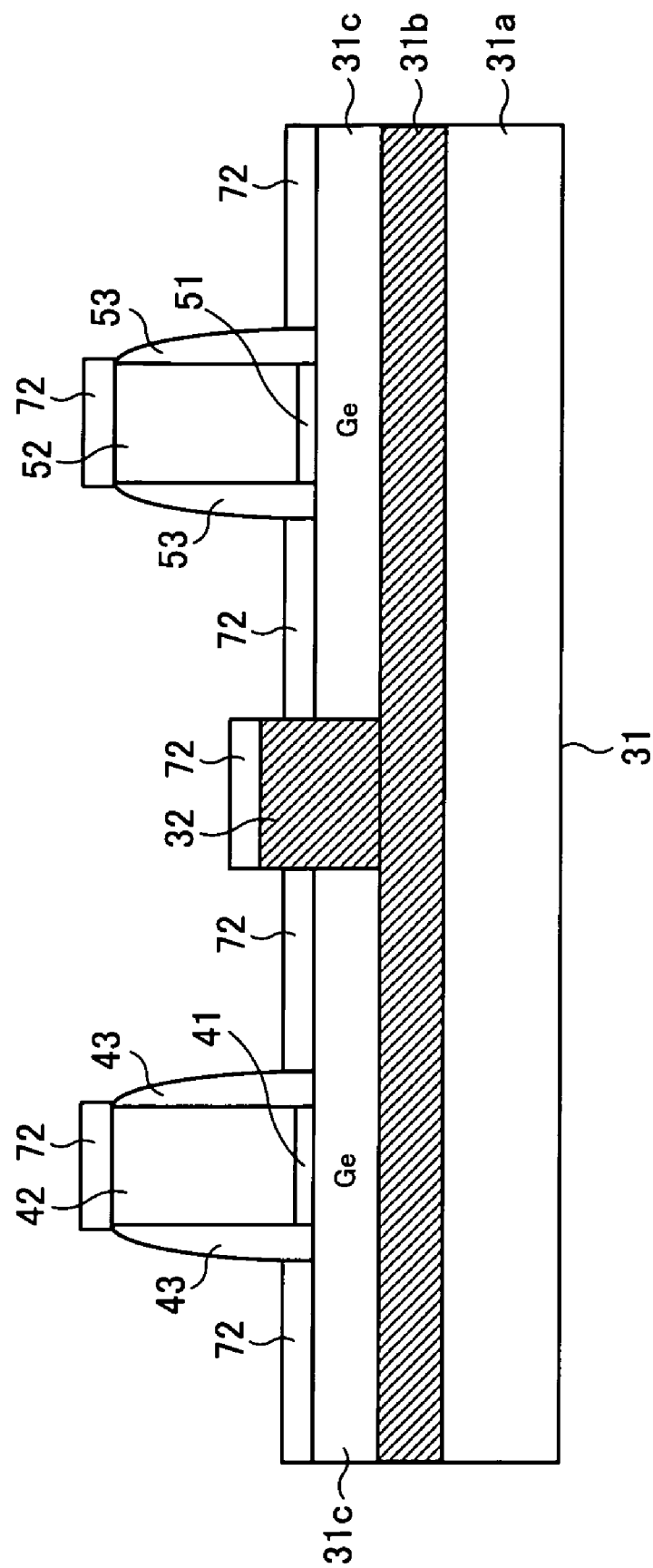
FIG. 28 is a schematic sectional view showing an Ni deposition process in another method for fabricating the CMOSFETs by using a GOI substrate.
Figure 29:
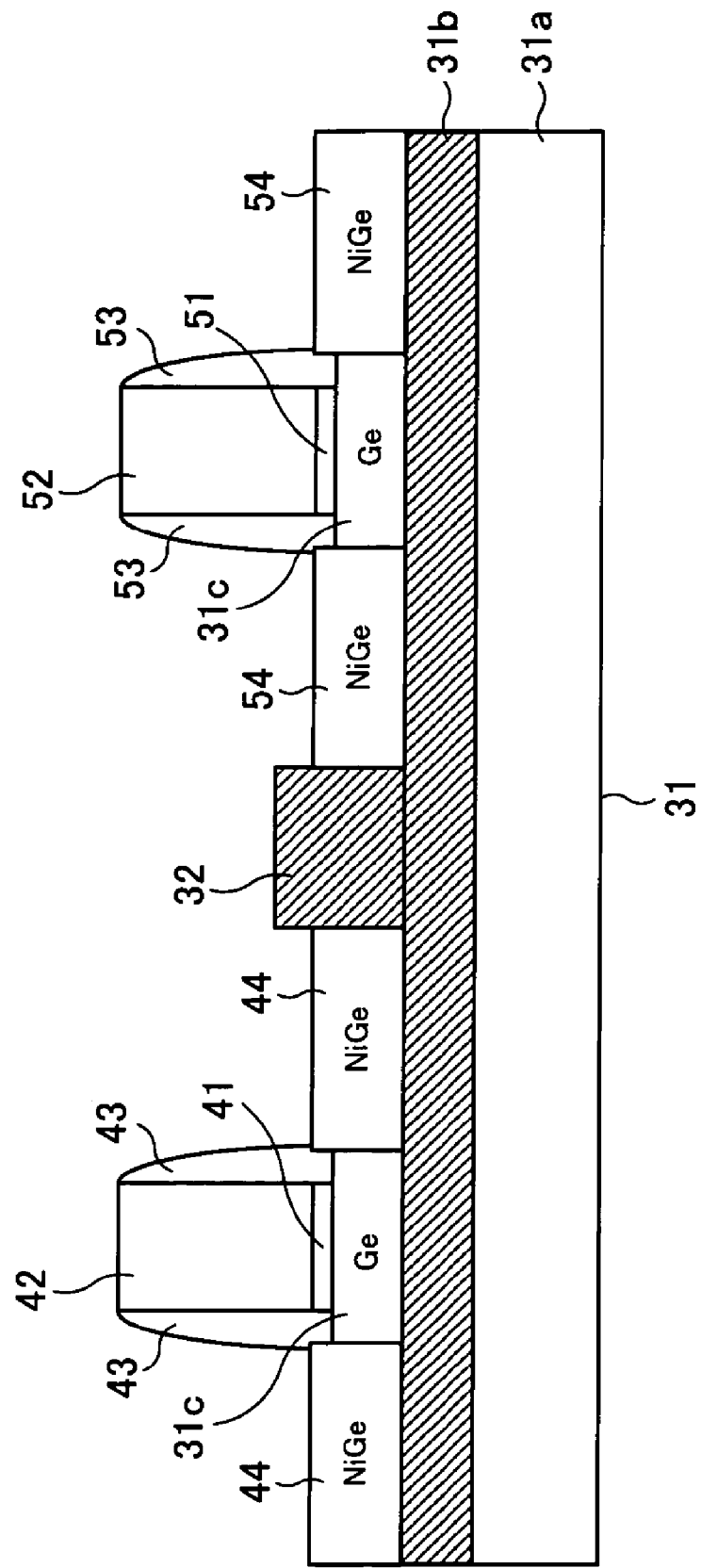
FIG. 29 is a schematic sectional view showing an RTA treatment process in another method for fabricating the CMOSFETs by using the GOI substrate.
Figure 30:
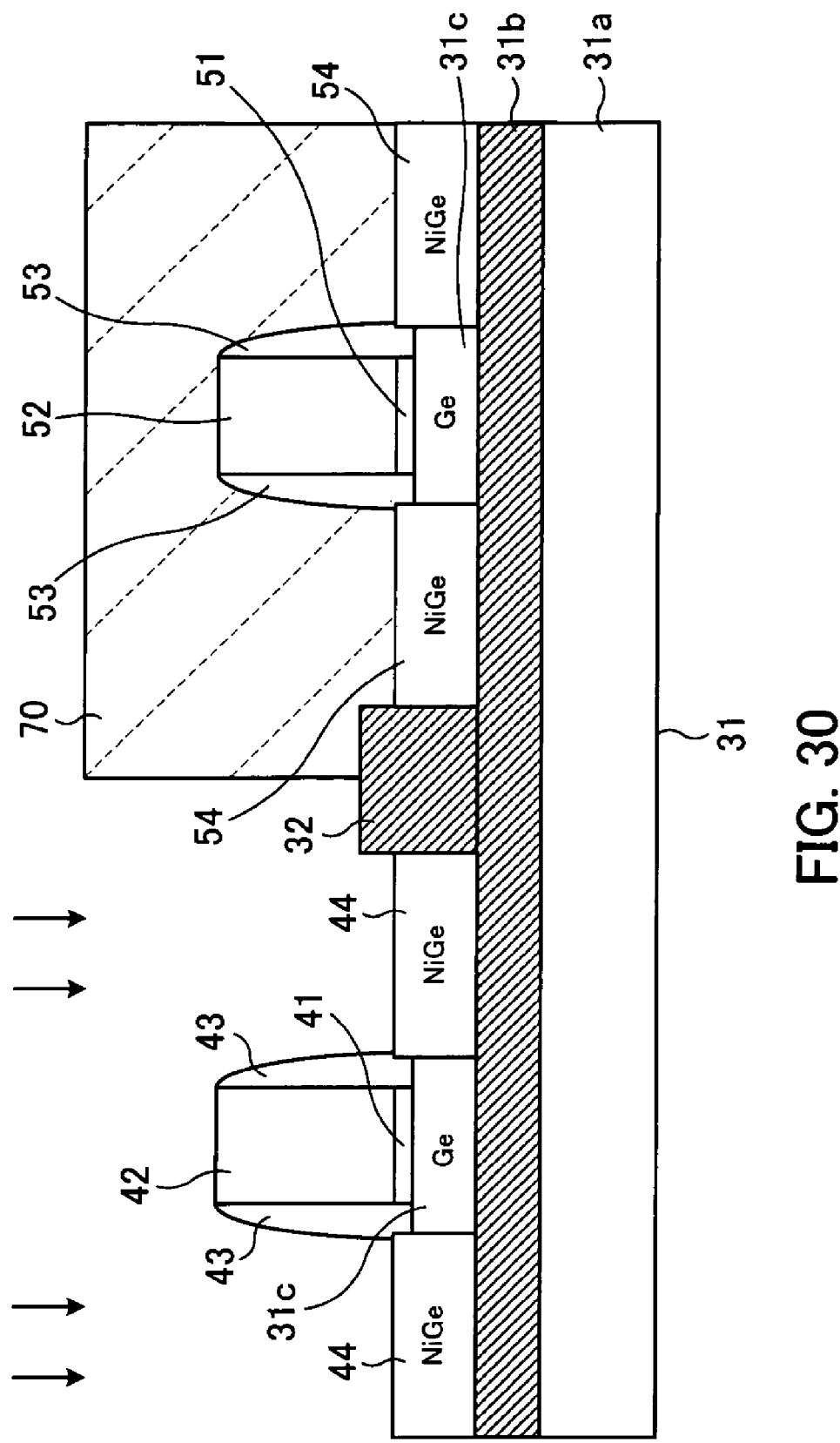
FIG. 30 is a schematic sectional view showing an nMOSFET source and drain region ion implantation process in another method for fabricating the CMOSFETs by using the GOI substrate.
Figure 31:
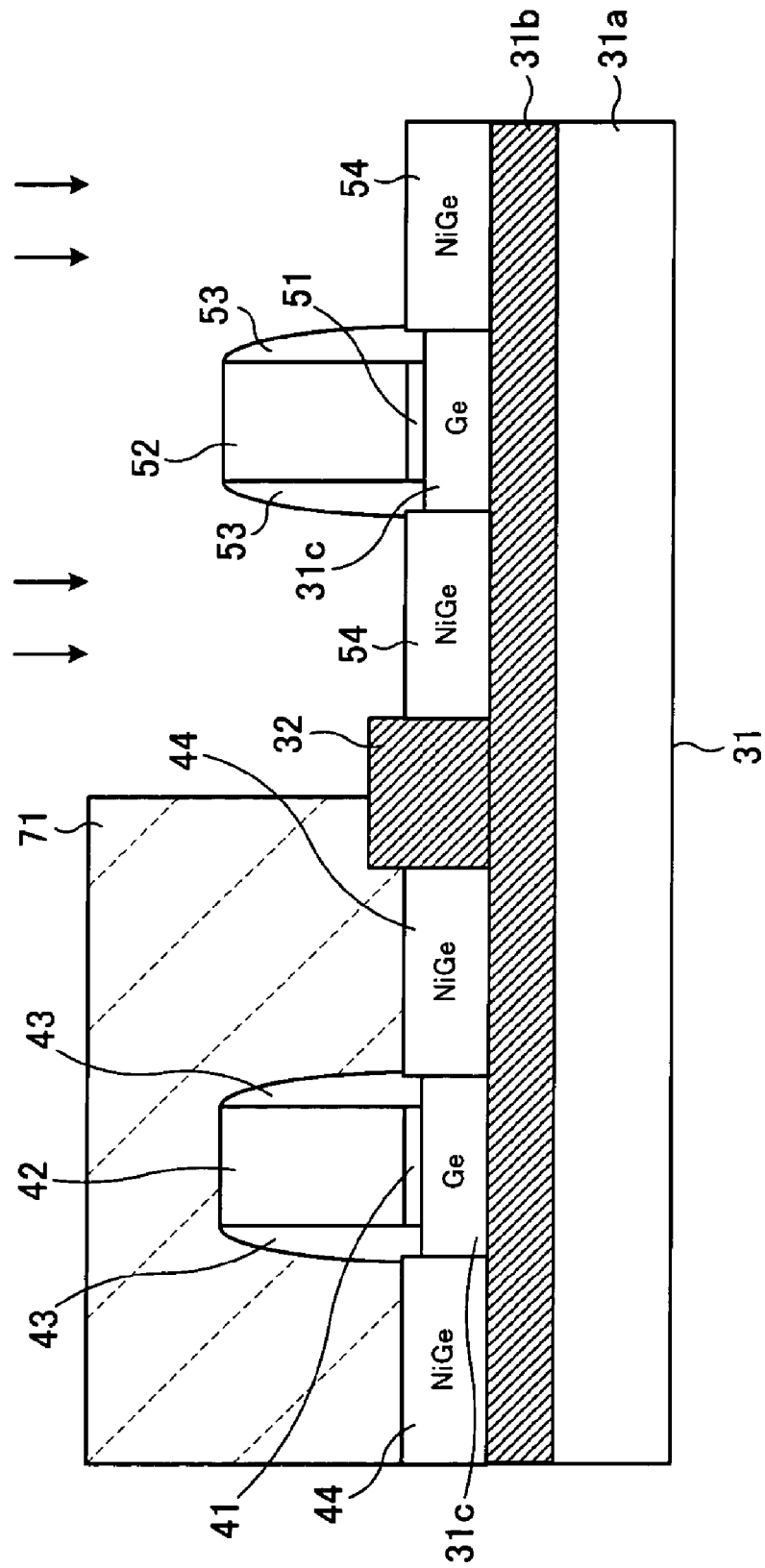
FIG. 31 is a schematic sectional view showing a pMOSFET source and drain region ion implantation process in another method for fabricating the CMOSFETs by using the GOI substrate.

FIG. 28 is a schematic sectional view showing an Ni deposition process in another method for fabricating the CMOSFETs by using a GOI substrate. FIG. 29 is a schematic sectional view showing an RTA treatment process in another method for fabricating the CMOSFETs by using the GOI substrate. FIG. 30 is a schematic sectional view showing an nMOSFET source and drain region ion implantation process in another method for fabricating the CMOSFETs by using the GOI substrate. FIG. 31 is a schematic sectional view showing a pMOSFET source and drain region ion implantation process in another method for fabricating the CMOSFETs by using the GOI substrate. Components in FIGS. 28 through 31 that are the same as those shown in FIGS. 22 through 27 are marked with the same symbols and detailed descriptions of them will be omitted.

As shown in FIG. 23, an STI 32 is formed first in a Ge layer 31c with a thickness of about 30 nm on a GOI substrate 31 and ion implantation is performed to adjust a threshold. As shown in FIG. 24, gate insulating films 41 and 51, gate electrodes 42 and 52, and sidewalls 43 and 53 are then formed.

As shown in FIG. 28, an Ni film 72 with a thickness of about 15 nm is then deposited on an entire surface. As shown in FIG. 29, RTA treatment is then performed under predetermined conditions to form NiGe layers 44 and 54. A portion of the Ni film 72 which has not reacted yet is removed.

As shown in FIG. 30, after the NiGe layers 44 and 54 are formed in this way, a region where a pMOSFET 50a is to be formed is masked with a resist film 70. Ion implantation is performed on a region where an nMOSFET 40 is to be formed under a predetermined condition by using phosphorus, arsenic, antimony, or the like or sulfur, selenium, tellurium, or the like. The resist film 70 is removed after the ion implantation.

As shown in FIG. 31, the region where the nMOSFET 40 is to be formed is then masked with a resist film 71. Ion implantation is performed on the region where the pMOSFET 50a is to be formed under a predetermined condition by using boron, aluminum, gallium, or the like or sulfur, selenium, tellurium, or the like. The resist film 71 is removed after the ion implantation.

Finally, RTA treatment is performed under predetermined conditions to make ionized atoms implanted diffuse and segregate. By doing so, a segregation layer 45 is formed at a junction interface between the NiGe layer 44 and the Ge layer 31c and a segregation layer 45a is formed at a junction interface between the NiGe layer 54 and the Ge layer 31c.

In the procedure for fabricating the CMOSFETs 30a shown in FIGS. 23, 24, and 28 through 31, if after the implantation of ions in the region where the nMOSFET 40 is to be formed and the removal of the resist film 70 shown in FIG. 30, RTA treatment is performed under predetermined conditions instead of the implantation of ions in the region where the pMOSFET 50a is to be formed shown in FIG. 31, then the CMOSFETs 30 shown in FIG. 21 are fabricated.

The case where a stress is applied to a germanium channel region in a germanium channel MOSFET included in CMOSFETs will now be described.

Figure 32:
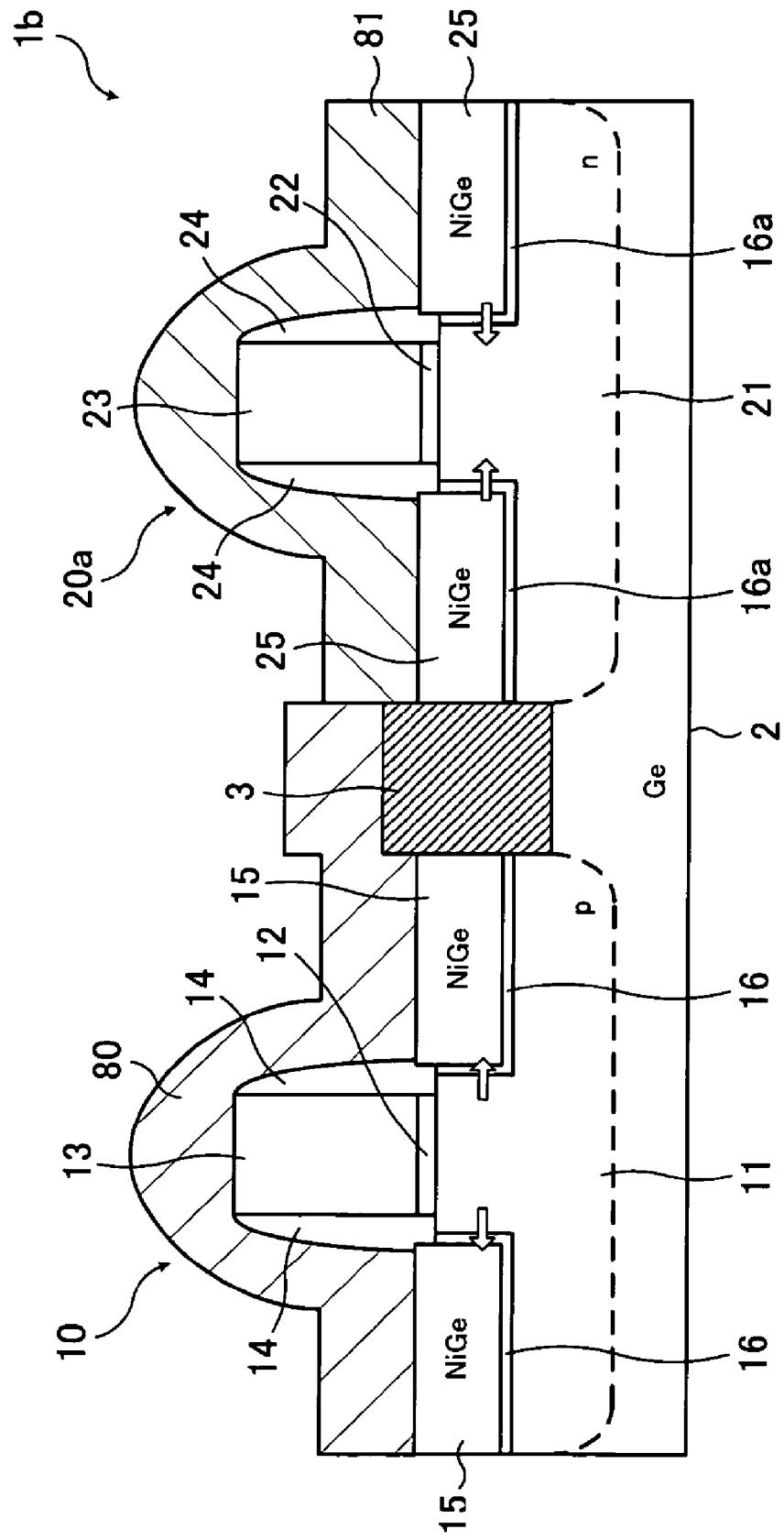
FIG. 32 shows an example of a method for fabricating stress applied CMOSFETs.

FIG. 32 shows an example of a method for fabricating stress applied CMOSFETs. Components in FIG. 32 that are the same as those shown in FIG. 11 are marked with the same symbols and detailed descriptions of them will be omitted.

CMOSFETs 1b shown in FIG. 32 includes an nMOSFET 10 in which a segregation layer 16 is formed at a junction interface between an NiGe layer 15 and a Ge substrate 2 and a pMOSFET 20a in which a segregation layer 16a is formed at a junction interface between an NiGe layer 25 and the Ge substrate 2. In addition, with the CMOSFETs 1b, a first silicon nitride (SiN) film 80 which covers the nMOSFET 10 is formed as a first film and a second SiN film 81 which covers the pMOSFET 20a is formed as a second film.

The first SiN film 80 formed on the nMOSFET 10 applies a tensile stress to a Ge channel region thereof, while the second SiN film 81 formed on the pMOSFET 20a applies a compressive stress to a Ge channel region thereof (shown by thick arrows in FIG. 32). These different stresses can be realized by controlling the crystal structures of the first SiN film 80 and the second SiN film 81.

Usually, a tensile stress increases electron mobility and a compressive stress increases hole mobility. With the CMOSFETs 1b, an effect caused by forming the segregation layers 16 and 16a is obtained. In addition, by applying a tensile stress to the Ge channel region of the nMOSFET 10 and applying applies a compressive stress to the Ge channel region of the pMOSFET 20a, electron mobility and hole mobility are increased.

The CMOSFETs 1b having the above structure can be fabricated by, for example, the following procedure.

Processes for forming the nMOSFET 10 and the pMOSFET 20a included in the CMOSFETs 1b are the same as those shown in FIGS. 12 through 16, so processes performed after them will now be described.

Figure 33:
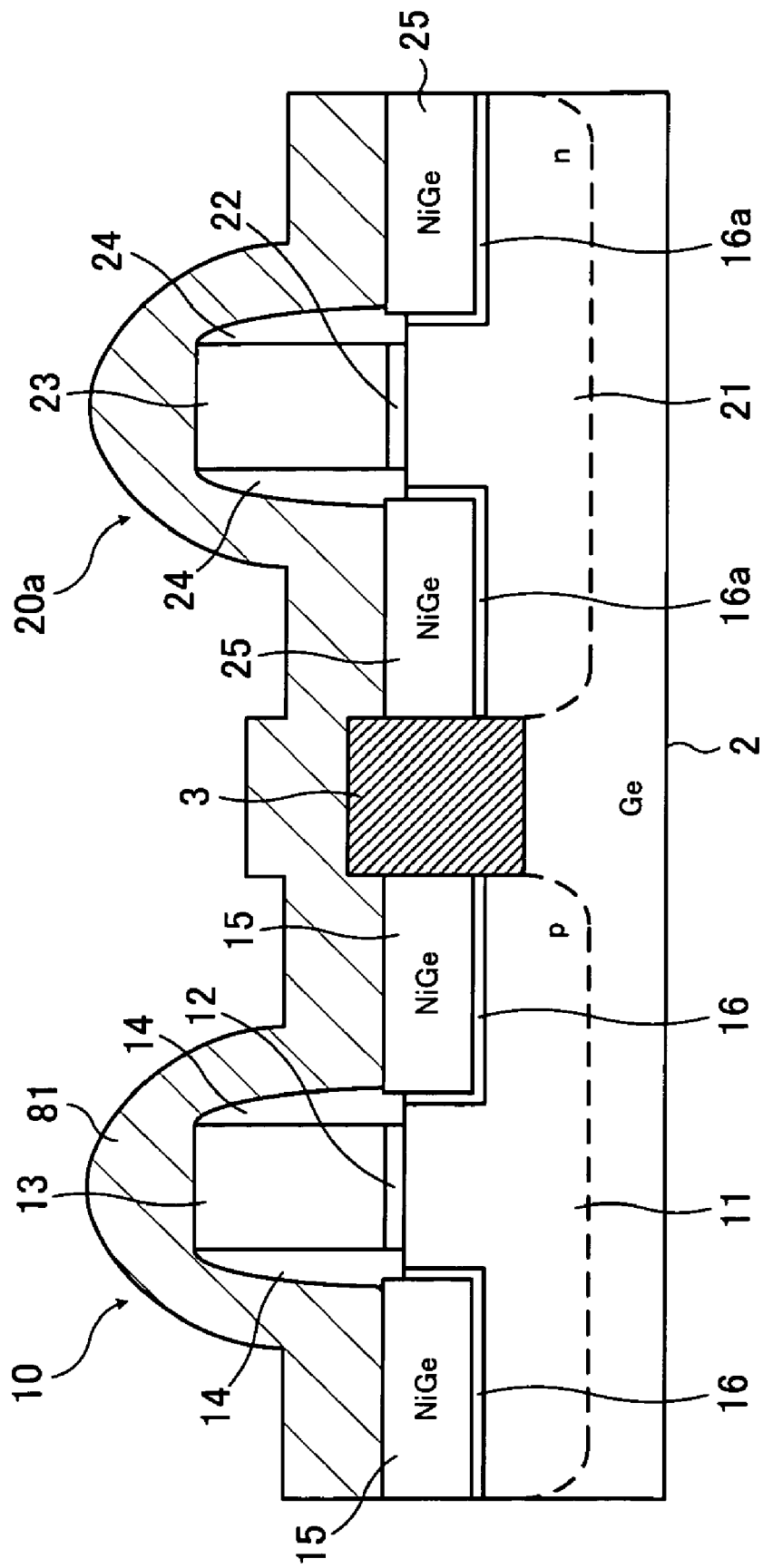
FIG. 33 is a schematic sectional view showing a compressive stress application SiN film deposition process.
Figure 34:
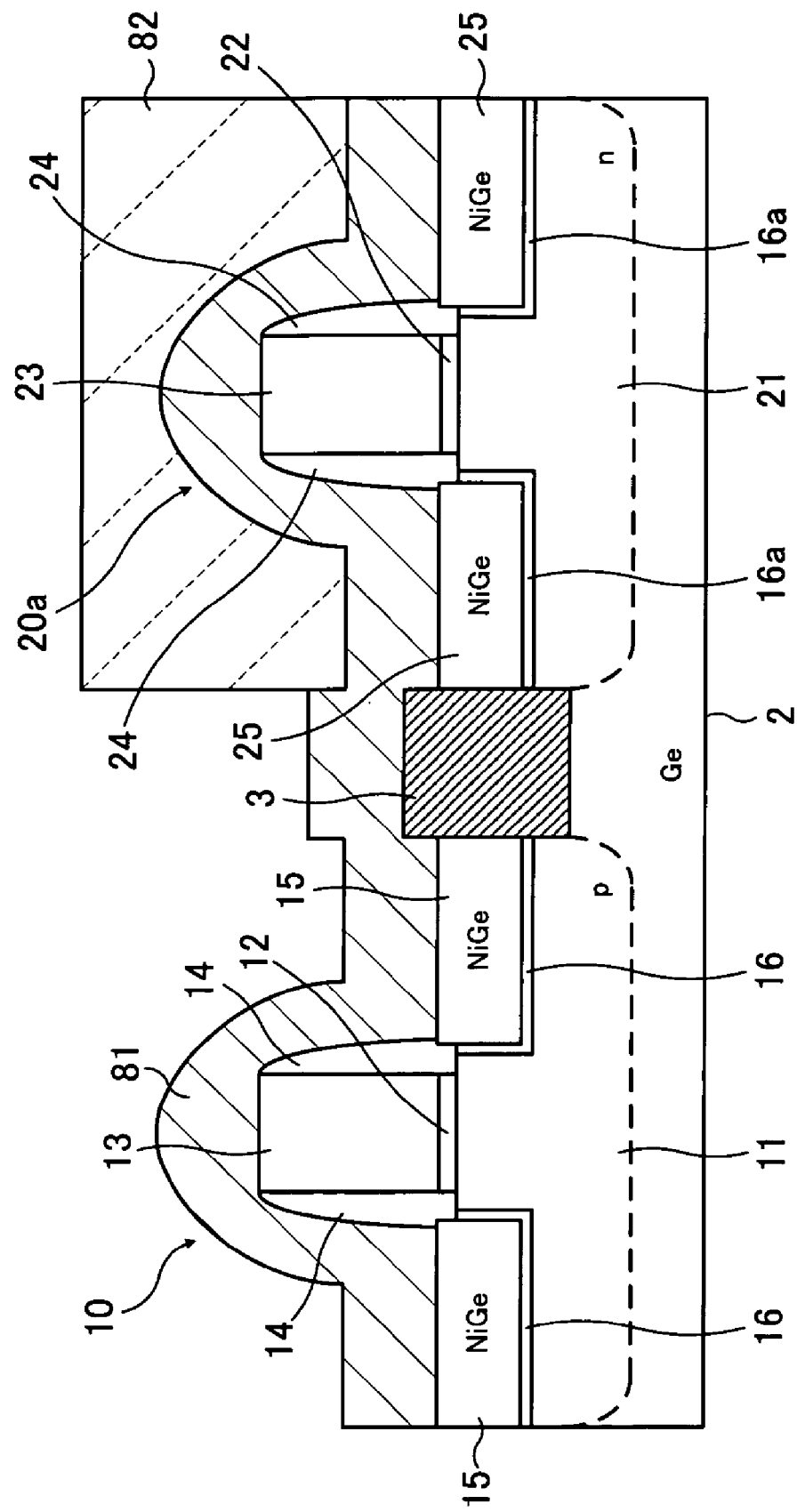
FIG. 34 is a schematic sectional view showing a compressive stress application SiN film selective removal process.
Figure 35:
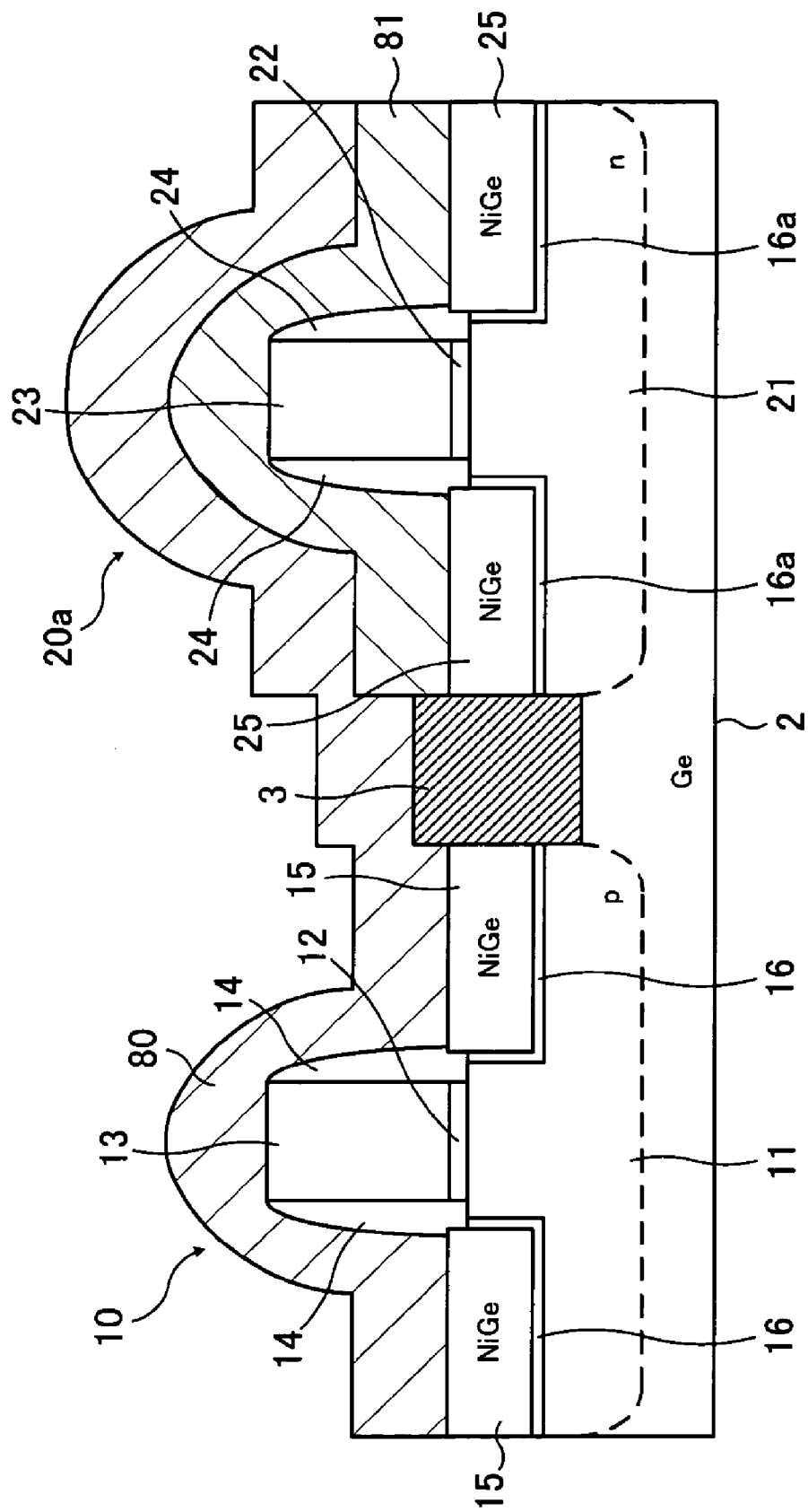
FIG. 35 is a schematic sectional view showing a tensile stress application SiN film deposition process.
Figure 36:
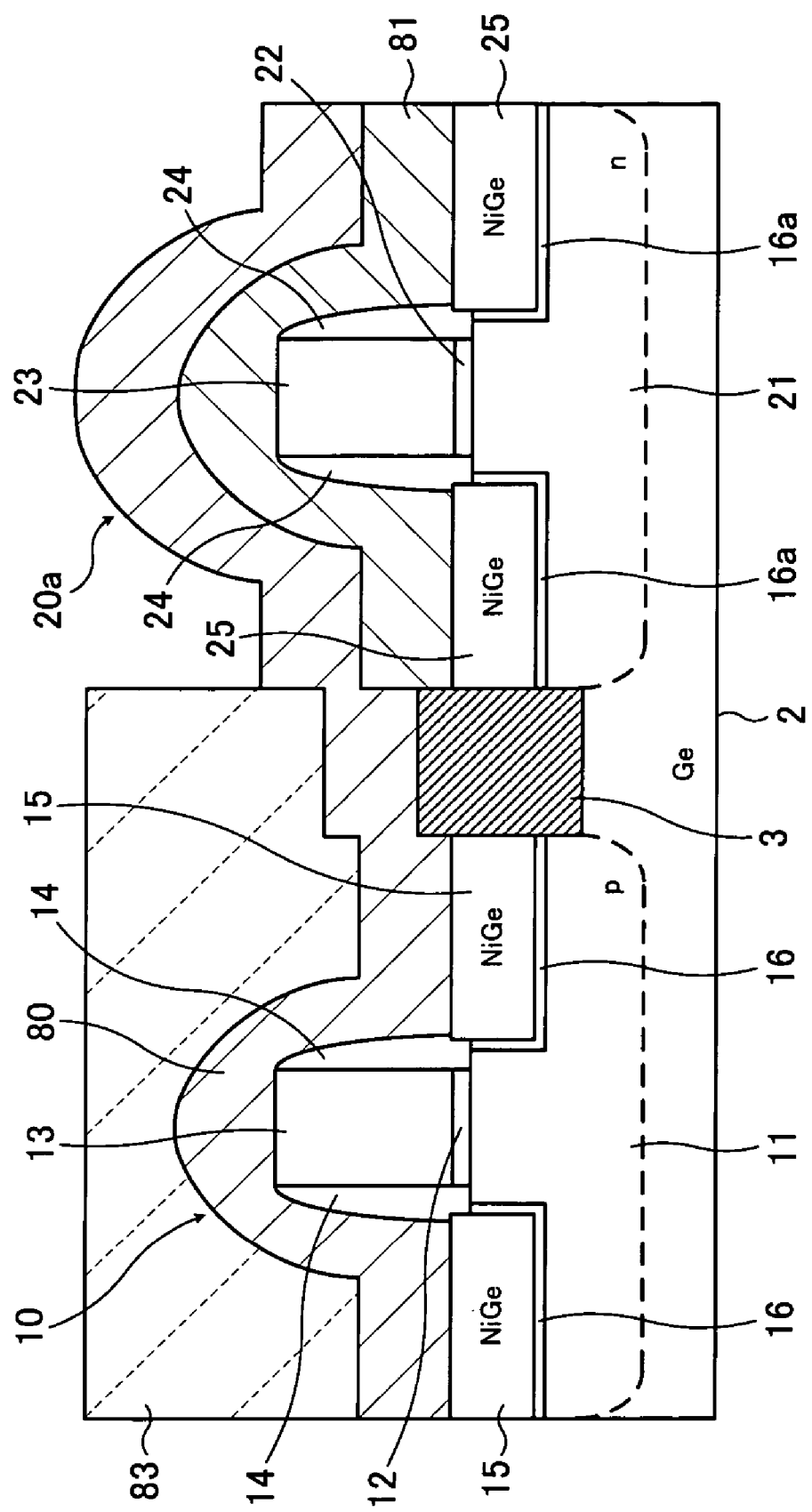
FIG. 36 is a schematic sectional view showing a tensile stress application SiN film selective removal process.

FIG. 33 is a schematic sectional view showing a compressive stress application SiN film deposition process. FIG. 34 is a schematic sectional view showing a compressive stress application SiN film selective removal process. FIG. 35 is a schematic sectional view showing a tensile stress application SiN film deposition process. FIG. 36 is a schematic sectional view showing a tensile stress application SiN film selective removal process.

As shown in FIG. 33, after the nMOSFET 10 and the pMOSFET 20a included in the CMOSFETs 1b like those shown in FIG. 11 are formed by the processes shown in FIGS. 12 through 16, the second SiN film 81 used for applying a compressive stress is deposited first on an entire surface. In this process, both the nMOSFET 10 and the pMOSFET 20a are covered with the second SiN film 81.

As shown in FIG. 34, the pMOSFET 20a side is then masked with a resist film 82 and the second SiN film 81 formed on the nMOSFET 10 is removed by reactive ion etching (RIE) or wet etching. After the second SiN film 81 formed on the nMOSFET 10 is removed, the resist film 82 is removed.

As shown in FIG. 35, after the second SiN film 81 formed on the nMOSFET 10 is removed, the first SiN film 80 used for applying a tensile stress is deposited on an entire surface. As a result, the nMOSFET 10 is covered with the first SiN film 80 and the pMOSFET 20a is covered with the second SiN film 81 and the first SiN film 80 formed thereon.

As shown in FIG. 36, the nMOSFET 10 side is then masked with a resist film 83 and the first SiN film 80 formed on the pMOSFET 20a side is removed by the RIE or the wet etching. After the first SiN film 80 formed on the pMOSFET 20a side is removed, the resist film 83 is removed.

As a result, the nMOSFET 10 is covered with the first SiN film 80 which applies a tensile stress to the Ge channel region and the pMOSFET 20a is covered with the second SiN film 81 which applies a compressive stress to the Ge channel region. Therefore, the CMOSFETs 1b shown in FIG. 32 is obtained.

The descriptions have been given with the CMOSFETs 1a fabricated by using the Ge substrate 2 as an example. However, the above technique of applying a stress to a Ge channel region is also applicable to the CMOSFETs 30a fabricated by using the GOI substrate 31. Moreover, this technique is applicable to the CMOSFETs 1 in which the segregation layer 16 is formed only in the nMOSFET 10, the CMOSFETs 30 in which the segregation layer 45 is formed only in the nMOSFET 40, or CMOSFETs having Ge channel regions and not having a segregation layer.

In the above example, a predetermined stress is applied to each of the channel regions of the nMOSFET 10 and the pMOSFET 20a. However, a predetermined stress may be applied to only one of the channel regions of the nMOSFET 10 and the pMOSFET 20a.

As has been described in the foregoing, the junctions between the channel region and the source region and between the channel region and the drain region in the CMOSFETs 1, 1a, 1b, 30, or 30a including a germanium n-channel MOSFET and a germanium p-channel MOSFET are Schottky barriers. In addition, when occasion demands, the segregation layer 16, 16a, 45, or 45a is formed by making appropriate atoms segregate at the junction interface. By doing so, a low-resistance junction at which a concentration gradient is high can be formed compared with a conventional structure in which junctions between a channel region and a source region and between the channel region and a drain region are pn junctions. Furthermore, Schottky barrier height suitable for the nMOSFET 10 or 40 or the pMOSFET 20, 20a, 50, or 50a can be obtained. Therefore, the ultrahigh-speed CMOSFETs 1, 1a, 1b, 30, or 30a having a germanium channel can be realized.

In the above examples, germanium is used in the channel regions of the CMOSFETs 1, 1a, 1b, 30, or 30a. However, the technique of changing Schottky barrier height by the segregation layer 16, 16a, 45, or 45a of predetermined atoms is also applicable to CMOSFETs in which silicon germanium is used in channel regions by, for example, using a SiGe substrate or a silicon germanium on insulator (SGOT) substrate. In this case, the same effect that is described above can be obtained.

The energy band gap of silicon germanium is between the energy band gap of germanium (0.66 eV) and the energy band gap of silicon (1.12 eV) and depends on its germanium composition. If the composition of germanium contained in silicon germanium increases, its energy band gap lessens and approximates the energy band gap of germanium. The CMOSFETs 1, 1a, 1b, 30, or 30a in which silicon germanium is used in the channel regions differ from the CMOSFETs 1, 1a, 1b, 30, or 30a in which germanium is used in the channel regions only in Schottky barrier height obtained in the case of the segregation layer 16, 16a, 45, or 45a not being formed (initial value of Schottky barrier height). Accordingly, the same techniques that are used for the CMOSFETs 1, 1a, 1b, 30, or 30a in which germanium is used in the channel regions are applicable to CMOSFETs in which silicon germanium is used in channel regions, and the same effects that are obtained in the CMOSFETs 1, 1a, 1b, 30, or 30a can be achieved.

In the above examples, nickel is used for forming the intermetallic compound. However, another metal may be used. The merit of using nickel is, for example, that a low-resistance NiGe layer can be formed stably at a temperature which is relatively low and which is within a predetermined range. Another usable metal is titanium (Ti), cobalt (Co), Pt, or the like. In this case, a condition under which an intermetallic compound is formed should be set properly with the relationship between heat treatment temperature and a stable phase for each metal taken into consideration. For example, if titanium or cobalt is used, a Ti or Co film is formed on germanium and RTA treatment is then performed at a temperature between about 400 and 600° C. By doing so, a high-quality titanium germanium (TiGe) layer or cobalt germanium (CoGe) layer can be formed. If platinum is used, a high-quality PtGe layer can be formed under the same condition that is adopted in the case of using nickel.

Two or more of nickel, titanium, cobalt, platinum, and the like may be used. In this case, metals to be combined are selected with a characteristic of each metal, such as whether an intermetallic compound is formed as a result of the diffusion of each metal into germanium or the diffusion of germanium into each metal at heat treatment time, taken into consideration.

The case where nickel and platinum are combined for forming an intermetallic compound will now be described as an example. In this case, a platinum nickel (PtNi) film is deposited in place of the Ni film. If the PtNi film is formed by, for example, the sputtering method, an Ni target and a Pt target are used or a target of a Pt—Ni alloy of predetermined composition is used. After that, the same procedure and condition that are adopted in the case of only the Ni film being deposited can be applied. If nickel and platinum are combined in this way, the occurrence of cohesion on the surface of the PtNi film can be suppressed effectively at the time of performing heat treatment after the formation of the PtNi film, compared with the case where the Ni film is formed.

For example, the above-mentioned material for, thickness of, and fabrication method of each component included in the CMOSFETs 1, 1a, 1b, 30, or 30a can be selected at will according to required characteristics or the like of the CMOSFETs 1, 1a, 1b, 30, or 30a to be fabricated.

The above descriptions have been given with the CMOSFETs 1, 1a, 1b, 30, or 30a as an example. However, it is a matter of course that an nMOSFET and a pMOSFET can be fabricated individually. In this case, the nMOSFET or the pMOSFET can be fabricated according to the above method for fabricating the CMOSFETs 1, 1a, 1b, 30, or 30a. Furthermore, an nMOSFET alone or a pMOSFET alone can be fabricated, so a semiconductor device including an nMOSFET or a pMOSFET and another circuit element can be fabricated.

In the present invention the complementary field-effect transistors including the n-channel field-effect transistor and the p-channel field-effect transistor each having the Ge or SiGe channel region and the source and drain regions formed of an intermetallic compound which contains germanium are fabricated. As a result, the operation speeds of both the n-channel field-effect transistor and the p-channel field-effect transistor can be increased and ultrahigh-speed complementary field-effect transistors having Ge or SiGe channels can be realized.

In addition to such complementary field-effect transistors, an n-channel field-effect transistor alone or a p-channel field-effect transistor alone can be fabricated. Therefore, an ultrahigh-speed n-channel or p-channel field-effect transistor can be realized.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A method for fabricating complementary field-effect transistors, the method comprising:

forming a metallic film on first regions and second regions of $Si_xGe_{1-x}$ ($0 \leq x < 1$) layer, the first regions being where a first channel region of an n-channel field-effect transistor is to be formed therebetween, the second regions being where a second channel region of a p-channel field-effect transistor is to be formed therebetween;

after the forming of the metallic film, performing heat treatment to form source and drain regions of a compound in the first regions and in the second regions, respectively, the compound including at least one of silicon and germanium and including a metal of the metallic film;

after the performing of the heat treatment, implanting first atoms which are phosphorus, arsenic, antimony, sulfur, selenium or tellurium in the source and drain regions formed in the first regions; and diffusing the first atoms to form first layers which include the first atoms at first junction interfaces between the first channel region and the source region formed in one of the first regions and between the first channel region and the drain region formed in another of the first regions.

2. The method according to claim 1, further comprising, after the forming of the first layers:

forming a first film for applying a tensile stress to the first channel region; and forming a second film for applying a compressive stress to the second channel region.

3. The method according to claim 1, further comprising:

after the performing of the heat treatment, implanting second atoms which are boron, aluminum, gallium, sulfur, selenium or tellurium in the source and drain regions formed in the second regions; and diffusing the second atoms to form second layers which include the second atoms at second junction interfaces between the second channel region and the source region formed in one of the second regions and between the second channel region and the drain region formed in another of the second regions.

4. The method according to claim 3, further comprising, after the forming of the first layers and the second layers:

forming a first film for applying a tensile stress to the channel region of the n-channel field-effect transistor; and forming a second film for applying a compressive stress to the channel region of the p-channel field-effect transistor.

5. The method according to claim 1, further comprising, before the forming of the metallic film:

forming a first gate electrode over the first channel region with a first gate insulating film therebetween; and forming a second gate electrode over the second channel region with a second gate insulating film therebetween.

* * * * *